(12) United States Patent
Potega

(10) Patent No.: US 6,945,803 B2
(45) Date of Patent: Sep. 20, 2005

(54) POSITIONABLE-CONNECT APPARATUS FOR ELECTRICALLY COUPLING SELECTED ELECTRICAL DEVICES

(76) Inventor: Patrick Potega, 7021 Vicky Ave., West Hills, CA (US) 91207-2314

( * ) Notice: Subject to any disclaimer, the term of this patent is extended or adjusted under 35 U.S.C. 154(b) by 0 days.

(21) Appl. No.: 10/401,637

(22) Filed: Mar. 27, 2003

(65) Prior Publication Data

US 2003/0186592 A1 Oct. 2, 2003

Related U.S. Application Data

(60) Division of application No. 09/378,781, filed on Aug. 23, 1999, now Pat. No. 6,634,896, which is a continuation-in-part of application No. 09/105,489, filed on Jun. 26, 1998, now Pat. No. 6,152,597.
(60) Provisional application No. 60/051,035, filed on Jun. 27, 1997, and provisional application No. 60/055,883, filed on Aug. 15, 1997.

(51) Int. Cl.⁷ .............................................. H01R 27/00
(52) U.S. Cl. ...................................... 439/218; 439/668
(58) Field of Search ................................ 439/218, 668, 439/669, 221–224

(56) References Cited

U.S. PATENT DOCUMENTS

| | | | | |
|---|---|---|---|---|
| 3,120,585 A | * | 2/1964 | Harris, Jr. .................... 200/6 R |
| 3,289,149 A | * | 11/1966 | Pawloski ..................... 439/669 |
| 3,829,814 A | * | 8/1974 | Straus ......................... 439/101 |
| 4,158,472 A | * | 6/1979 | Seiden et al. ................ 439/502 |
| 4,420,216 A | * | 12/1983 | Motoyama et al. .......... 439/188 |
| 4,487,466 A | * | 12/1984 | Petit et al. ................... 439/222 |
| 4,934,367 A | * | 6/1990 | Daglow et al. .............. 439/527 |
| 5,137,469 A | * | 8/1992 | Carpenter et al. ........... 439/578 |
| 5,569,053 A | * | 10/1996 | Nelson et al. .............. 439/668 |
| 5,823,796 A | * | 10/1998 | Bethurum ................... 439/76.1 |
| 5,915,995 A | * | 6/1999 | Meyer et al. ................ 439/668 |
| 6,044,472 A | * | 3/2000 | Crohas ........................ 713/300 |
| 6,109,797 A | * | 8/2000 | Nagura et al. ................ 385/88 |
| 6,149,469 A | * | 11/2000 | Kim ............................ 439/668 |
| 6,459,175 B1 | * | 10/2002 | Potega ........................ 307/149 |

* cited by examiner

Primary Examiner—Hae Moon Hyeon

(57) ABSTRACT

A connector apparatus for a power and/or data interface, comprised of a connector assembly (220 in FIG. 6) which has a positionable plug (217A) with conductors (219A–D), and an insulated shaft (243) that engages a receptacle (257) having conductors (263A and B, 261A and B, 259A and B, 265A and B), and related elements (245, 245A, and 219E–G) that redirect electrical signals upon insertion and rotation of the plug. Redirecting electrical signals enables host devices, power sources, and peripherals—such as a host device (321 in FIG. 7A), its battery source (299), as well as one or more attachable peripherals (309, 310, and 311)—to signal transfers in ways they could not without such an apparatus. By locating a connector apparatus (220) in replaceable modules, such as battery packs (299), users can upgrade and enhance the functionality of a multiplicity of existing (and future) electronic and electrical goods.

38 Claims, 9 Drawing Sheets

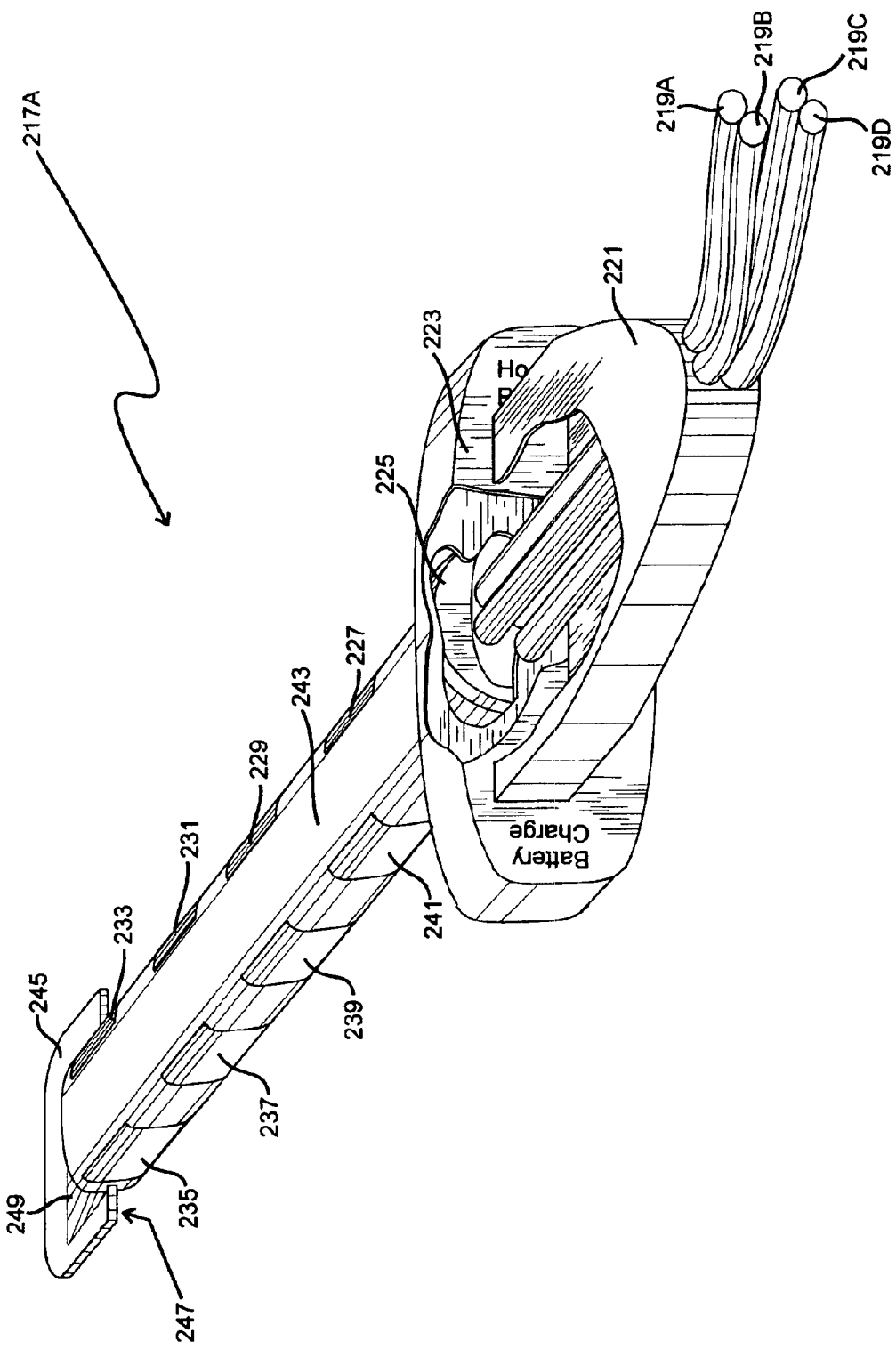

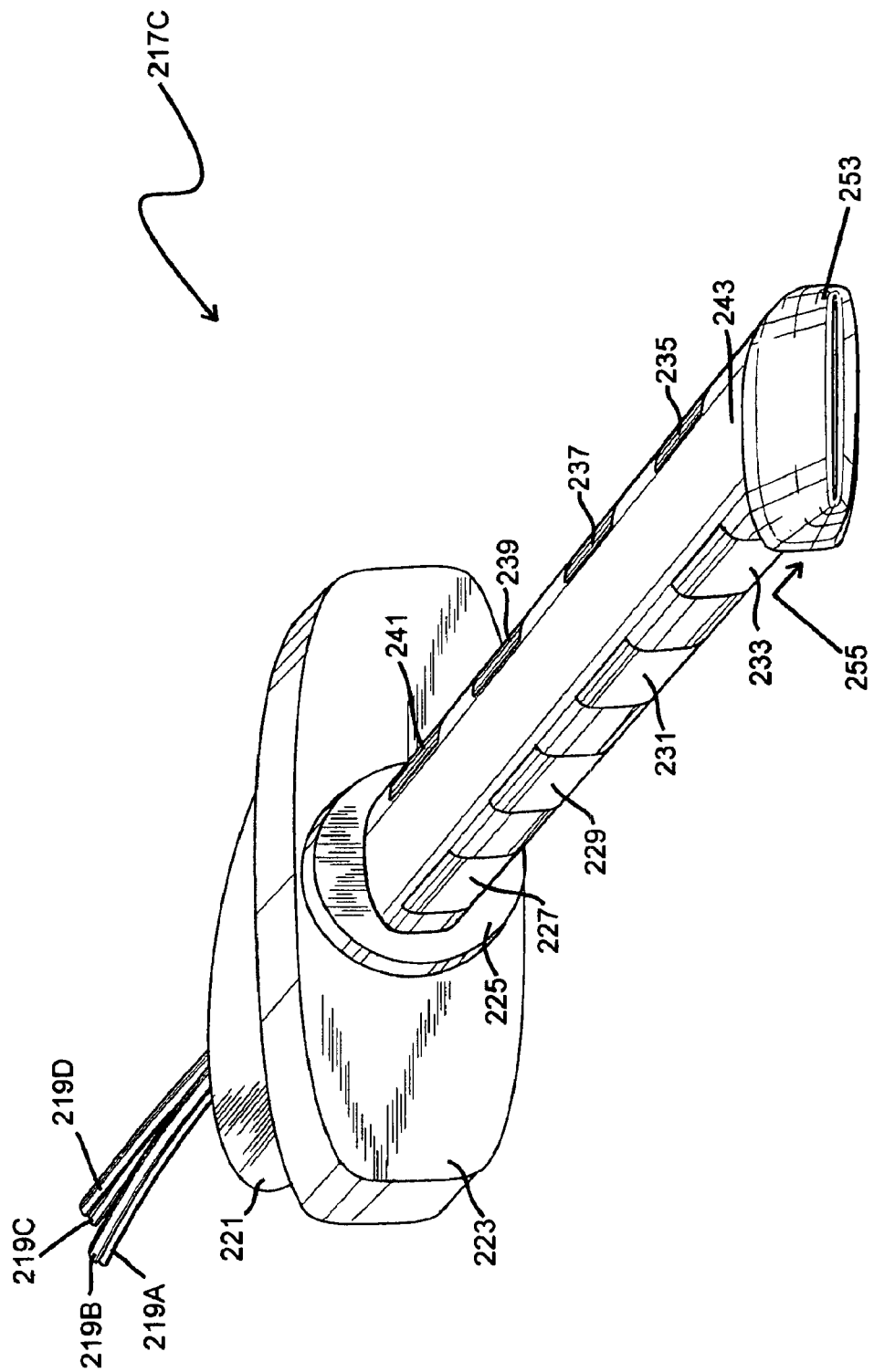

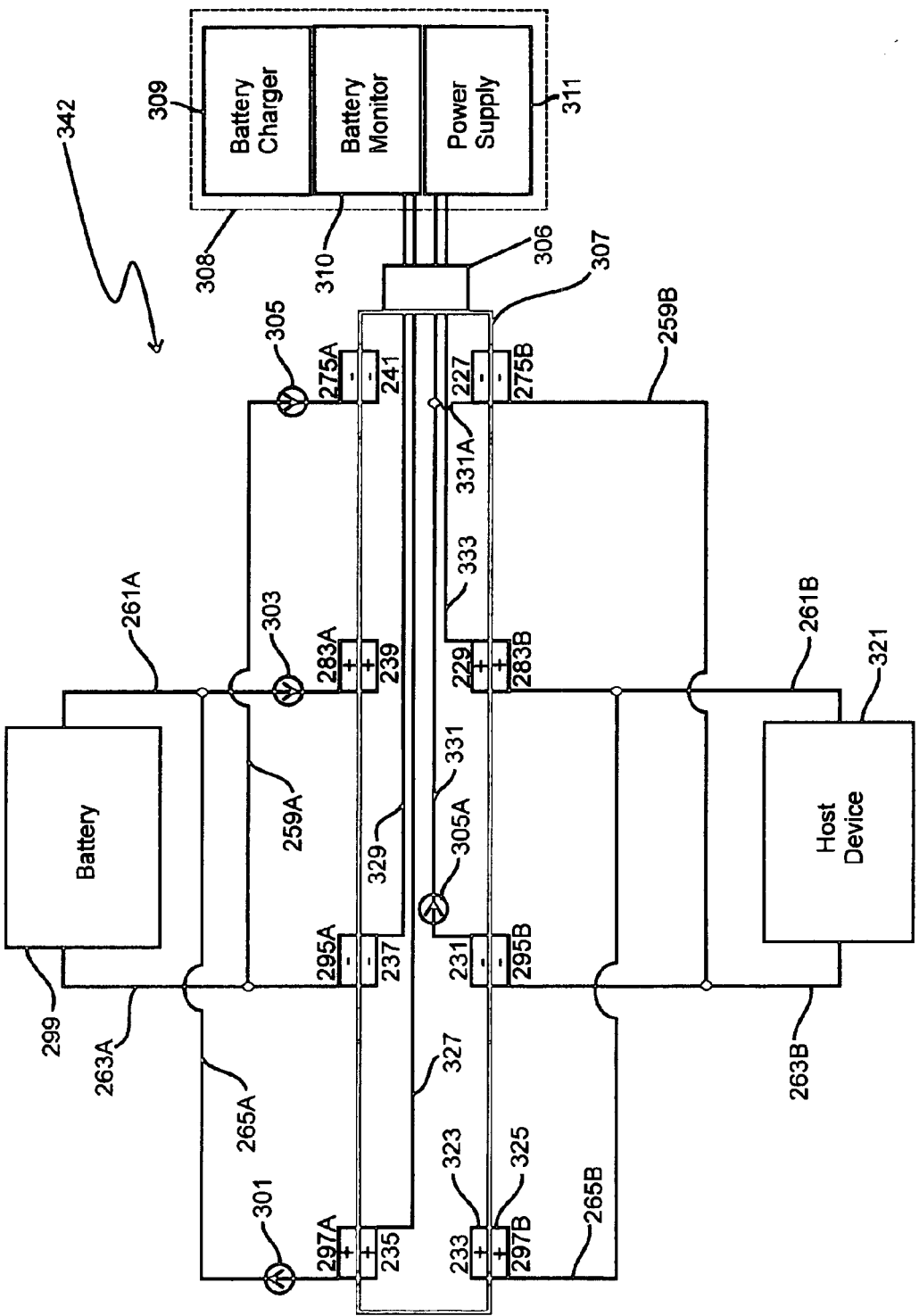

POSITIONABLE-CONNECT APPARATUS FOR ELECTRICALLY COUPLING SELECTED ELECTRICAL DEVICES

CROSS-REFERENCE TO RELATED APPLICATIONS

This application is a division of "Method and Apparatus for Transferring Electrical Signals Among Electrical Devices," now U.S. Pat. No. 6,634,896, issued 21 Oct. 2003, previously filed as U.S. patent application Ser. No. 09/378,781, dated 23 Aug. 1999 as a CIP of "Apparatus for Monitoring Temperate of a Power Source," filed previously as U.S. patent application Ser. No. 09/105,489, dated 26 Jun. 1998, and subsequently as U.S. Pat. No. 6,152,597 issued 28 Nov. 2000; and claims the benefit of previously filed U.S. Provisional Patent Application No. 60/051,035, dated 27 Jun. 1997, and "A Resistive Ink-Based Thermistor," U.S. Provisional Patent Application No. 60/055,883, dated 15 Aug. 1997, as well as International Patent Application No. PCT/US98/12807, dated 26 Jun. 1998; and further claims the benefit of "Apparatus for a Power and/or Data I/O," U.S. Provisional Patent Application No. 60/097,748, filed 24 Aug. 1998; "Hardware to Configure Battery and Power Delivery Software," U.S. Provisional Patent Application No. 60/114,412, dated 31 Dec. 1998, and subsequently U.S. patent application Ser. No. 09/475,946, "Hardware for Configuring and Delivering Power," dated 31 Dec. 1999; "Software to Configure Battery and Power Delivery Hardware," U.S. Provisional Patent Application No. 60/114,398, dated 31 Dec. 1998, and subsequently U.S. patent application Ser. No. 09/475,945, "Software for Configuring and Delivering Power," dated 31 Dec. 1999; and "Universal Power Supply," now U.S. Pat. No. 6,459,175, issued 1 Oct. 2002, previously filed as U.S. patent application Ser. No. 09/193,790, dated 17 Nov. 1998 (also as International Patent Application No. PCT/US98/24403, dated 17 Nov. 1998), filed previously as U.S. Provisional Patent Application No. 60/065,773, dated 17 Nov. 1997.

FIELD OF INVENTION

The invention relates to connector assemblies, specifically to connectors that reconfigure by rotational positioning of their plugs that are used to inter-connect power sources, powered devices, and a multiplicity of attachable peripherals.

BACKGROUND OF THE INVENTION

Devices that have removable battery packs, such as laptop computers, personal audio and video players, etc., most often have two power input jacks. The first power-input port is obvious . . . it is where the connector from the external wall adapter, AC/DC power-conversion adapter, DC/DC automotive cigarette-lighter adapter, external battery charger, etc., is plugged in.

The second power-input port is not so obvious . . . it is where a removable battery pack connects to its associated host device. Usually, this is a power (or mixed-signal power and data) connector hidden in a battery bay, or expressed as a cord and connector inside a battery compartment, such as is found in some cordless phones. The connector between a battery pack and its associated host device may simply be a group of spring contacts and a mating set of contact pads. This second power port is not used for external power (a host's removable battery power source is usually not classified as "external" power). The battery power port is so unrecognized that even supplemental external "extended run-time" battery packs, as are available from companies like Portable Energy Products, Inc. (Scotts Valley, Calif.), connect to the same traditional power jack to which the external power supply does.

The connector assembly herein exploits this un-utilized battery-to-host interface in a number of ways. As will be seen, a battery pack's power port is, in many ways, a far more logical power interface than the traditional power-input jack. By using a flexible and scaleable connector that is small enough to be enclosed within a battery pack housing, and providing sufficient connector contacts to handle power, the usefulness of external power devices and the battery pack itself can be enhanced.

Also, "smart" battery packs support connectors that are mixed signal, i.e., both power and data, therefore external power devices can data communicate with host devices and smart batteries, often facilitating device configuration, operation and power monitoring.

Some of the reasons why the battery-contact interface isn't used are that it's often inaccessible. In laptop computers, for example, the battery-to-host-device connector is often buried deep in a battery bay. The connector assembly described in this document is built into the battery pack itself, at a location where easy access to a connector is available. Where appropriate, conductors from a non-removable battery are routed to an accessible location on the host device. Even when the location of the connector assembly is remote from the battery pack, the interface addressed is that between the battery pack and its associated connector on the host device.

Another reason for the lack of attention to the battery's power connector is that the type of connector used between a battery and its host device is not usually of the design and style that would easily lend itself to being attached to the end of a power cord. A good example of how awkward such battery access connectors can be is the "empty" battery housing with power cord that is popular with camcorders. The camcorder's "faux" battery pack shell snaps into the normal battery pack mount, and there is usually a hardwired cord to a power-conversion adapter. This makes for a considerable amount of bulky goods to transport. That is the case with cellular phones, as well, with "empty" battery housings that plug into an automotive cigarette lighter, or a battery pack with an integrated charger. These are often bulkier than the battery pack they replace and, almost always, one must have a unique assembly—complete with cords—dedicated to a specific make or model of cellular phone.

The connector assemblies shown in the various figures, and described herein, are designed to be of the look and style normally associated with power and or data cords. Barrel-style connectors, and segmented-pin-types are common connector styles. By defining new barrel connectors that feature segmented contacts, or using segmented pin connectors in wiring schemes that create new connectivity paths, hitherto unknown ways of dealing with safety through power sub-system configurations are achieved. No bulky external add-ons are used. Instead, miniaturized connectors that can be embedded within an existing battery pack define new ways of powering battery-powered devices.

The battery packs discussed here are not empty battery enclosures, with only passthrough wiring. The original battery cells, circuit boards, fuses, etc., are all present and the connectors shown herein provide means to have a battery pack operate normally when the plugs are removed (or replaced).

Battery Pack Removal

Another reason a battery port connector is not used is that to access this unexploited power port would require removing the battery pack, which would result in the loss of available battery power. Some host devices require that a battery pack be present, as the battery may be serial-wires. Also, host devices are known that use the battery pack as a "bridge" battery that keeps CMOS, clocks, etc., functioning. Battery removal could negatively impact such devices. Removing a battery pack also results in even more bulky things to carry around, which hardly fits the travel needs of someone carrying a laptop or other mobile device.

By embedding connectors in the battery pack, no circuits are created within the host devices. This is useful because battery packs are virtually always removable and replaceable. Instead of having to pre-plan and design-in new power and data paths into a host device, the replaceable battery pack contains these power and data paths. Simply replacing a battery pack upgrades any host device. By placing the technology in a fully-functional battery pack, it is not necessary to remove the battery pack during connector operations . . . instead, keeping the battery pack in its host device, where it belongs, is essential.

Devices that use external power-conversion adapters invariably are designed to always charge the device's removable battery pack every time the external adapter is used. It seems logical that keeping the battery capacity at 100% is a sound practice. However, certain rechargeable battery chemistries don't offer the charge/recharge cycle life that was available with "older" battery technologies. Lithium-Ion (Li-Ion) batteries, for example, can last for only 300 cycles, and sometimes even less than that. In average use, an Li-Ion battery can have a useful life (full run-time, as a function of capacity) of less than a year, and nine months isn't uncommon. Constantly "topping-off" a Lithium-Ion battery only degrades useful battery life.

Being able to elect when to charge the battery, independent of powering the host device, would prolong the life of expensive batteries. By delivering power from external power adapters and chargers through connectors at a newly-defined battery power port, a user need only perform a simple act, such as rotating a connector to select a battery-charge; mode, a host-power only mode, or both.

Battery Charging Risks

Battery charging is a destructive process in other ways than repeated unnecessary battery charging sessions. Low-impedance batteries, such as Lithium-Ion, generate heat during the charging process. This is especially true if a cell-voltage imbalance occurs for, as resistance increases, the entire battery pack can overheat. Lithium-ion cells have a reputation for volatility. For example, an article in the Apr. 2, 1998, edition of *The Wall Street Journal* reported on the potentials of fire, smoke and possible explosion of Li-Ion batteries on commercial aircraft (Andy Pasztor, "Is Recharging laptop in Flight a Safety Risk?," The Wall Street Journal, Apr. 2, 1998, pp. B1, B12).

To be able to easily disengage a volatile battery cell cluster from its integrated, hardwired battery charging circuit has obvious safety benefits. Several of the modalities of the connector assemblies discussed herein lend themselves to a simple battery bypass circuit within the battery pack, so that a host device can be powered from an external power source such as an aircraft seat-power system, without charging the battery. This function is achievable by simply replacing an existing battery pack with one that incorporates the connector assembly. This is a cost-effective, simple and convenient solution to an important safety concern. Because the connector assembly is a modification to an existing battery pack, and battery products already have a well-established and wide distribution network, availability of this safety device is widespread. No entirely new devices are required to be designed and fabricated, since the connector assembly is essentially an upgrade modification.

Power-Conversion Adapters

Battery flammability and explosive volatility are related to inappropriate power devices upstream of the battery pack. Connecting a power-conversion adapter that has an output voltage not matched to the input voltage of a host device is an easy mistake to make. Laptop computer input voltages, for example, can range from 7.2 VDC, to 24 VDC. Within that voltage range are a significant number of AC/DC and DC/DC adapters that are power-connector-fit compatible, but which output incompatible voltages. A count of notebook computer power-conversion adapters available from one mail order company numbered over 250 discrete products (iGo, Reno, Nev., www.iGoCorp.com). The probability of a voltage mismatch indicates a serious concern.

Compared to the multiplicity of vast and diverse input voltages battery-powered host devices require, input voltages at battery power ports are not only limited, but more flexible. Since battery output voltages are a function of an individual cell voltage, multiplied by the number of cells wired in series or parallel, there are a limited number of output voltages for battery packs. For example, Lithium-Ion cylindrical cells are manufactured at only 3.6-volts (some are 4.2-volt cells). Thus, virtually every Li-Ion battery pack made outputs either 10.8, or 14.4 volts (with some relatively rare 12.6-volt cell clusters). If an external power-conversion adapter was designed to provide power to a notebook computer host device through the host device's battery port, it is possible that only two output voltages would be required, since the external adapter would electrically "look" to a host device as a battery pack. This adds value to a connector assembly that can eliminate the problem of there being some 42 different types of existing laptop power connectors.

Furthermore, battery pack output voltages vary as a function of charge state. A fully charged battery rated at 10.8-volts actually outputs voltages in a range from about 10-volts, through 14.0-volts (with transient voltages up to 16 volts), depending on the battery's state of charge or discharge. This same host device may be able to accept input voltages at its usual external power-adapter input port within a narrow voltage range of +/–1-volt. Thus, host devices have a far greater tolerance for potential voltage mismatches at their battery power ports, as compared to at the traditional power jack. By providing a power connector that uses the battery's power port, the number of external power devices is significantly reduced, and the overall risk of damaging a host device by a voltage mismatch is minimized.

The heat dissipation from charging a Lithium-Ion battery pack is compounded by the heat being generated by advanced high-speed CPUs. With computer processors running so hot in portable devices that heat sinks, fans, heat pipes, etc., are required, the additional heat from charging a battery only intensifies the thermal issues.

The connector assembly described herein, by disengaging battery charging, extends the life of a host device's components and circuits that otherwise may be compromised or stressed by extended hours of exposure to heat. This is especially valid for host devices like laptop computers, since a number of these products are not used for travel, but instead spend almost all of their useful lives permanently plugged into the AC wall outlet in a home or office, serving as a desktop substitute. In such device applications, the need to repeatedly charge the laptop's battery has no practicality. By using a connector assembly that can be selectively put into a mode of battery charging only when necessary, the working life expectancy of these host devices can be extended by eliminating unnecessary overheating.

Energy Conservation

There's a less obvious reason to not charge batteries on commercial aircraft. Some commercial passenger aircraft provide power systems with power outlets at the passenger seat. The head-end aircraft power source is a generator, so the total amount of energy to power all of the aircraft's electrical system is limited. The Airbus A319, for example, has only sufficient generator capacity to provide seat power for less than 40 passengers' laptop computers (Airbus Service Information Letter (SIL), dated 8 Jan. 1999). A laptop computer being powered from an external power-conversion adapter uses 20–40% of the external power to charge its battery pack, which translates to about 15–30 Watts. Generating sufficient power to charge 200+ laptop batteries puts a considerable drain on the aircraft's electrical system.

Disabling battery charging by employing a connector assembly described herein is a cost-effective means of lowering an airline's operating costs, by minimizing the total load schedule of the cabin power grid. The airline saves the cost of the fuel required to operate the generator at a higher power capacity.

Airline operators have policies and in-flight rules that prohibit the types of passenger electronic devices that can legally operate on the plane. The use of RF devices, such as cellular phones, and radio-controlled toys, is banned on every commercial aircraft. Passengers may be confused on aircraft operated by American Airlines, for example, since selected passenger seats have power systems for laptop use. This airline's seat power outlet is a standard automotive cigarette-lighter port. An unsuspecting passenger, mistakenly assuming that the cigarette-lighter port was for cellular phones, could easily plug in and turn on a cell phone.

Because there are a number of modalities to the connector assembly described in this document, airlines can elect to use a specific connector style, shape or wiring scheme that is reserved for passenger seat-power. By limiting the use of a receptacle to battery packs for laptops, and not allowing the connector to be used in cellular phone battery packs, for example, an airline can control the types of passenger devices it allows to be connected to its cabin power system.

Battery-Only-Powered Devices

There is also a variety of battery-powered devices that does not have an external power-supply power input jack. Cordless power tools, flashlights, and other devices meant to run strictly on removable and/or externally rechargeable batteries may not have been manufactured with an alternative means of power. If the battery of a cordless drill goes dead, for example, the only recourse is usually to remove the battery and recharge it in its external charger. This is frustrating to anyone who has had to stop in the middle of a project to wait for a battery to recharge.

By integrating a new connector assembly, such as the ones shown in the figures and text herein, circuits can be created that use a host device's battery-power-port interface as a power connector through which power can be delivered from an external power source. A user can elect, when a power outlet is available, to operate devices such as battery-powered drills, saws, etc., from external power, simply by attaching a compliant external power adapter into the connector interface on an exposed face of the battery pack. With some modalities of the connector assembly that is the invention, an external charger can be connected as well, allowing simultaneous equipment use and battery charging in products that hitherto did not have these capabilities.

Devices with holders for individual battery cells fall into this same category of not having an external power port. If the device does have an external port, it is not wired to provide simultaneous battery charging. Not being able to charge replaceable battery cells in a battery holder that is inside the host device lessens the usefulness of rechargeable alkalines, for example.

It is more convenient to leave individually replaceable battery cells in their battery holder while charging, and a number of the modalities of the connector assembly discussed herein allow for that. The added convenience of being able to operate a host device instead of draining its rechargeable alkalines (these battery types typically can only be recharged 10–20 times, then must be discarded), reduces operating costs. The use of the connector assembly saves time, since the user doesn't have to take the time to remove each individual cell and place it in a special charger.

Operational Advantages

Given the above, a number of operational advantages of the connector assembly of the invention become apparent:

(a). A simple, low-cost connector can be used to electrically separate two devices, or a host device and its power system.

(b). By isolating the battery source, or a peripheral, from the original host device, new circuits are created that allow external power sources or battery chargers to perform more safely because the battery voltage can be verified before that external power is applied to a host device.

(c). Because a plug can function as a rotating selector switch that has more than one position, additional circuits or wiring configurations can be created to perform specialty functions or operations.

(d). As a "key," part of a male connector can be removable and interchangeable at the end of a power or data cord, to afford access control to equipment or electronic devices.

(e). With its very small form factors, a female connector can be embedded inside a battery pack, to make it a self-contained device that has a special power or data interface to external power or charging devices, or monitoring equipment. This can be accomplished without having to rewire or otherwise modify a host device. By replacing the existing battery pack with one configured with a connector assembly that is the invention, the functionality of both a battery and its host device is enhanced, without permanent reconfigurations to either the battery pack or host device.

(f). The connector assembly can be used as a replacement for an existing input power jack, with minimal modifications or rewiring.

(g). Problems with the existing multiplicity of connectors on electronic devices that allow incompatible external adapter output voltages are eliminated. Instead, the receptacle is simply wired in a different configuration, and a new plug is used to differentiate the two incompatible external adapters. Any fear of possible mismatched voltages between external power adapters and host devices is eliminated.

(h). In certain embodiments of the connector assembly that use a female connector that self-closes to reinstate a circuit, the need for an ON/OFF power switch in conjunction with a power input jack is eliminated. A plug is now defined that is configurable to turn the host device on when the plug is inserted into the receptacle.

(i). Certain embodiments of the connector assembly can be equipped with a latching mechanism that secures the plug and receptacle assemblies, an important feature for devices like laptops that are often moved around the local area in industrial or service applications.

(j). In certain environments, host devices that automatically charge their batteries when external power is applied can be easily modified by inserting a battery pack that has been upgraded to the connector assembly in this invention. Thus configured, the host device is rendered safety compliant.

(k). Simultaneous battery monitoring and power delivery from an external device can be done without modifying the internal circuitry of the host device.

(l). By installing a switch that responds to applied power signals, and locating that switch in either the plug or receptacle assemblies of the connector, battery monitoring and power delivery can occur with a two-conductor cable that shares more than two contacts in a connector assembly.

(m). Monitoring battery charging can be done by an external device attached to a connector assembly such as those defined herein, which may be capable of power, data, or both.

Applications

An upgraded battery pack that creates different electrical paths for power, data, or both when a plug is inserted or removed may, for example, include applications such as (but not limited to) the following:

1) Diminish the need to be charging a battery pack when an external power source is available. By not charging a battery every time a host device is connected to an external source of power, the life expectancy of the battery is increased. Since most rechargeable battery-powered electronic devices automatically charge their batteries when external power is connected, the use of a connector that disables the battery charge function increases the useful life of the battery, thus reducing total operating cost.

2) Some locations may not find battery charging practical. Battery charging can consume 20–40% of the entire load schedule of a host device's power requirements. If a car's battery is low, operating a host device such as a laptop for an extended time from the dashboard outlet could result in a stranded motorist.

3) Some transportation locations may not be suitable for battery charging. There is some risk in charging batteries, especially high-density Lithium-Ion batteries. An airline, or cruise ship operator, for example, may wish to limit the risk of an onboard battery-related fire or explosion. A simple and cost effective method would be to use battery packs and power cords that have a connector which disables the charge function, while still allowing an external power supply to power the host device only.

4) Extended-run-time external battery packs can be used to supplement a host-device's associated battery. These extra-high-capacity battery packs connect to a host device's existing power input jack. So configured, the external battery pack most likely is dedicating some of its stored energy to charging the host device's battery. This occurs because host systems are designed to charge the associated battery whenever external power is available.

As a power source, a host device usually does not distinguish an external battery from an AC/DC wall adapter, for example, so the extended-run-time battery loses its effectiveness by having to relinquish some amount of its stored energy to charging the host's battery. By using a connector as defined herein, the external battery pack can be routed through the host device's existing battery pack and, by doing so, the charging circuits with the host device are temporarily disabled while the external battery source is in use. This enhances the run-time of the external battery pack, and also eliminates inefficient energy transfers between the two batteries.

These non-limiting examples of applications for connector assemblies such as those described in this document show some practical real-world uses.

Design Parameters

Some of the design parameters required to achieve these uses may be:

1) Small package size, especially for the receptacle, since available space within battery packs is limited.

2) Straightforward way to integrate a female connector into an existing battery pack, or to install the receptacle in a new battery pack design in a way that doesn't require an inordinate amount of extra tooling or assembly.

3) Inexpensive

4) Simplicity of use

SUMMARY OF THE INVENTION

This invention relates to an apparatus for a power and/or data I/O port, specifically connector assemblies which have conductors, insulators and related elements that create different electrical paths than had previously been present in electrical and electronic devices. These newly-created electrical paths enable devices and peripherals to perform power and/or data functions in ways they could not without such an apparatus. By locating a connector assembly of the invention in replaceable modules, such as battery packs, users can upgrade and enhance the functionality of a multiplicity of existing (and future) electronic and electrical goods.

DESCRIPTION OF THE DRAWINGS

FIG. 3 is a second view of the plug shown in FIGS. 1 and 2, detailing its interface with a multi-conductor cord.

FIG. 4B shows a different tip configuration for a multi-contact plug similar to that shown in FIGS. 2, 3, and 4B.

FIG. 7B is a generic block diagram depicting a plug in a second position, related to a plug in a first position in FIG. 7A, to show the different power paths.

DETAILED DESCRIPTION OF THE INVENTION

Figure 1:
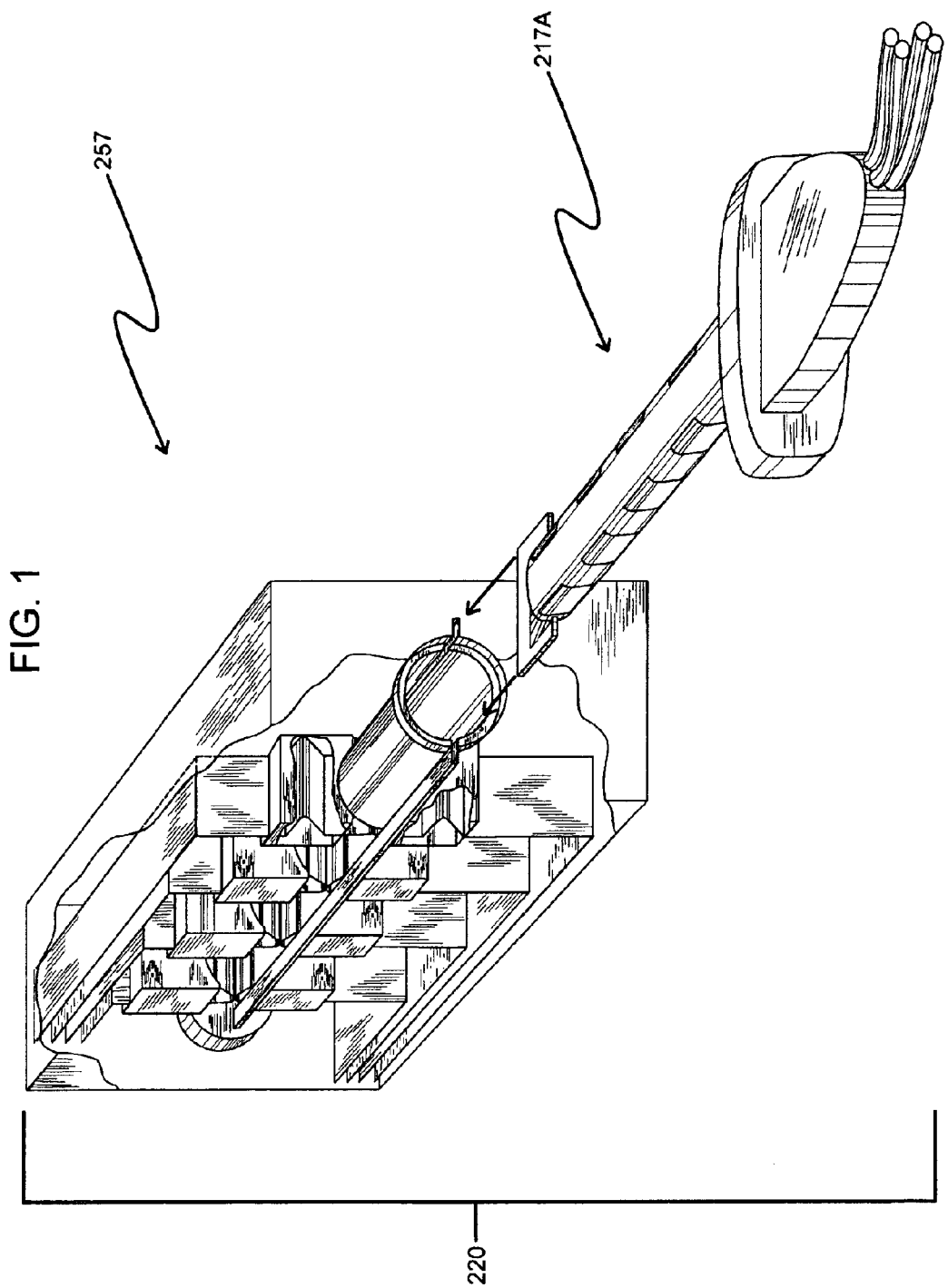
FIG. 1 depicts the two major elements—a multi-contact plug and a mating receptacle which has self-closing contacts—of a connector assembly that is rotated to various positions in order to create different electrical paths.

The invention provides a method and apparatus for transferring electrical signals including power and input/output information among multiple electrical devices and their components. In the following description, numerous specific details are set forth in order to provide a more thorough understanding of the present invention. It will be apparent, however, to one skilled in the art that the present invention may be practiced without these specific details. However, in order not to unnecessarily obscure the invention, all various implementations or alternate embodiments including well-known features of the invention may have not been described in detail herein.

Theory of Operation

In certain modalities of the invention, the concept of "Dominant Voltage" is applied as a means of delivering power to a battery-powered device. The positionable connector assembly illustrated herein is configurable to simultaneously electrically couple both a battery and an external power source along shared conductors. By such a configuration, the battery is immediately available to the host device should the power supply be turned off or fail. This provides a simple, yet effective, uninterruptible power supply capability.

Incorporating a means of controlling the direction of signal flow allows battery signals to flow to the power supply, but no signal from the power supply can flow to the battery. The power supply is this able to acquired power and/or data signals from the battery, which is essential to configuring the output of the controllable power supply. The power supply's output is determined by computations that use acquired battery voltage, for example. Thus, if the configurable power supply is acquiring voltage values from a 12-volt battery, the power supply's output will be a value in the 12-volt range.

As discussed, since both the battery and the power supply are connected and accessible to the host device, then a method must be established to make sure that the power supply, and not the battery, is the primary source of power. The concept of Dominant Voltage comes into play when two similar power sources are connected to a load. An example is a 12-volt light bulb to which are attached two 12-volt batteries, each battery being connected to the light bulb by a separate set of conductors. Assuming that the two batteries are not exactly matched in output, e.g., one of the batteries is further discharged than the other, thus the battery that is more discharged outputs a slightly lower voltage than the other. Dominant Voltage would result in the battery with the most charge delivering power to the light bulb.

This concept is well-recognized in the battery industry, where matching cells (often referred to as "cell balancing") in a battery pack is commonplace with Li-Ion batteries. Even with older battery chemistries, a superior or inferior cell in a pack is recognized as significant.

In applying Dominant Voltage to the invention, if the means of controlling directional signal flow is a diode the acquired battery voltage is depressed. The power supply computations take into account the voltage drop caused by a diode. The computations are also biased to yield a resulting voltage that is higher than the acquired battery voltage. This higher voltage ensures that the power supply, instead of the battery, is the primary source of power to the target device.

Because the connector assembly of the invention accesses the host device at its original battery terminals, the internal circuitry of the device is always designed to operate across a wide range of voltages. This is essential because battery output characteristics exhibit a wide range of voltages. A freshly charged battery label-rated at 12-volts will often output voltages 4–6 volts higher. Thus, by attaching an external power supply to the battery-input contacts at a host device, the power supply can operate at a higher range of input voltages than were the same power supply attached to the usual power-input jack commonly available on battery-powered devices for plugging in an external AC/DC power adapter.

In connector assembly configurations where both the external power supply and the battery have access to the host device along shared conductors, the output voltage of the power supply has to be greater than the output voltage of the battery. If not, the battery's higher voltage will be dominant, and the battery will power the host device, instead of power coming from the external power supply. The dominant-voltage effect allows the battery's power signal to immediately become available, should the external power supply ever lose power. Thus, the host device's battery remains a viable alternative source of power, even when the plug is still inserted in its mating receptacle.

In summary, a configuration of three interconnected devices wherein a battery and an attached power supply are both available to deliver power to a host device, the power supply is safely configured at a higher voltage than the battery's typical voltage, which allows the concept of Dominant Voltage to play a significant role in ensuring that the power supply—not the battery—is the primary source of power.

Principles of Operation

The principles of operation of a connector assembly that is the invention are important to defining individual implementations of the mechanical and physical connector of the present invention.

A non-limiting purpose of an embodiment of a positionable plug connector with multiple contact pads—and its mating receptacle—is to provide a means of reconfiguring electrical (power and/or data) circuits so that devices external to a host system can perform functions as if they were embedded in the host system. Also, electrical signals from external devices may address specific host sub-systems which, without such a connector assembly, would be inaccessible. A rotating plug (or a non-rotating multi-contact plug) and its associated female may create an operational "Y-connector" that temporarily disrupts and reconfigures a host device's original internal circuits. Such a Y-connector can be used, for example, to monitor one or more activities of a host device or its sub-systems by isolating and redirecting the I/O of that sub-system for such purposes as monitoring, powering, or sending/receiving data.

An example of a specific connector assembly function is to disrupt the power circuit between a host device and its internal battery. This disruption may be necessary because battery charging is not deemed appropriate at the time, or in a specific yet external power to the host system is needed. Perhaps an external power supply is input-side limited, because it is generator driven (or being powered by a car battery while the engine isn't running). It may not be prudent to deliver sufficient power to adequately run a host device, and simultaneously charge the host's internal battery. By being able to only power a host device, and not charge its battery, power-limited resources are conserved.

Upgrade Paths

The capabilities of multi-segmented, and/or rotateable connectors, allow multiple simultaneous functions to be performed with a host device and its sub-systems (or peripherals) without numerous complex interfaces. One connector assembly can deliver significant upgrades to electrical or electronic equipment for functions that were not originally designed into the device. Upgradeability can be achieved simply and cost effectively by locating the connector assembly and related wiring in a removable (or easily field-replaceable) module. For example, since rechargeable battery packs are user-removable, incorporating a connector in a replaceable battery housing provides a convenient means of modifying electrical circuits, both in the battery and, as a consequence, the battery's host device.

A host-device manufacturer can upgrade an end user's battery pack, replacing it with a battery pack having a receptacle 257 installed. A connector upgrade is convenient if installed in a battery pack, but other removable subsystems or modules, such as the external AC/DC power adapter normally purchased with a host device, also afford upgrade opportunities as locations where such a connector-assembly resides.

Figure 6:
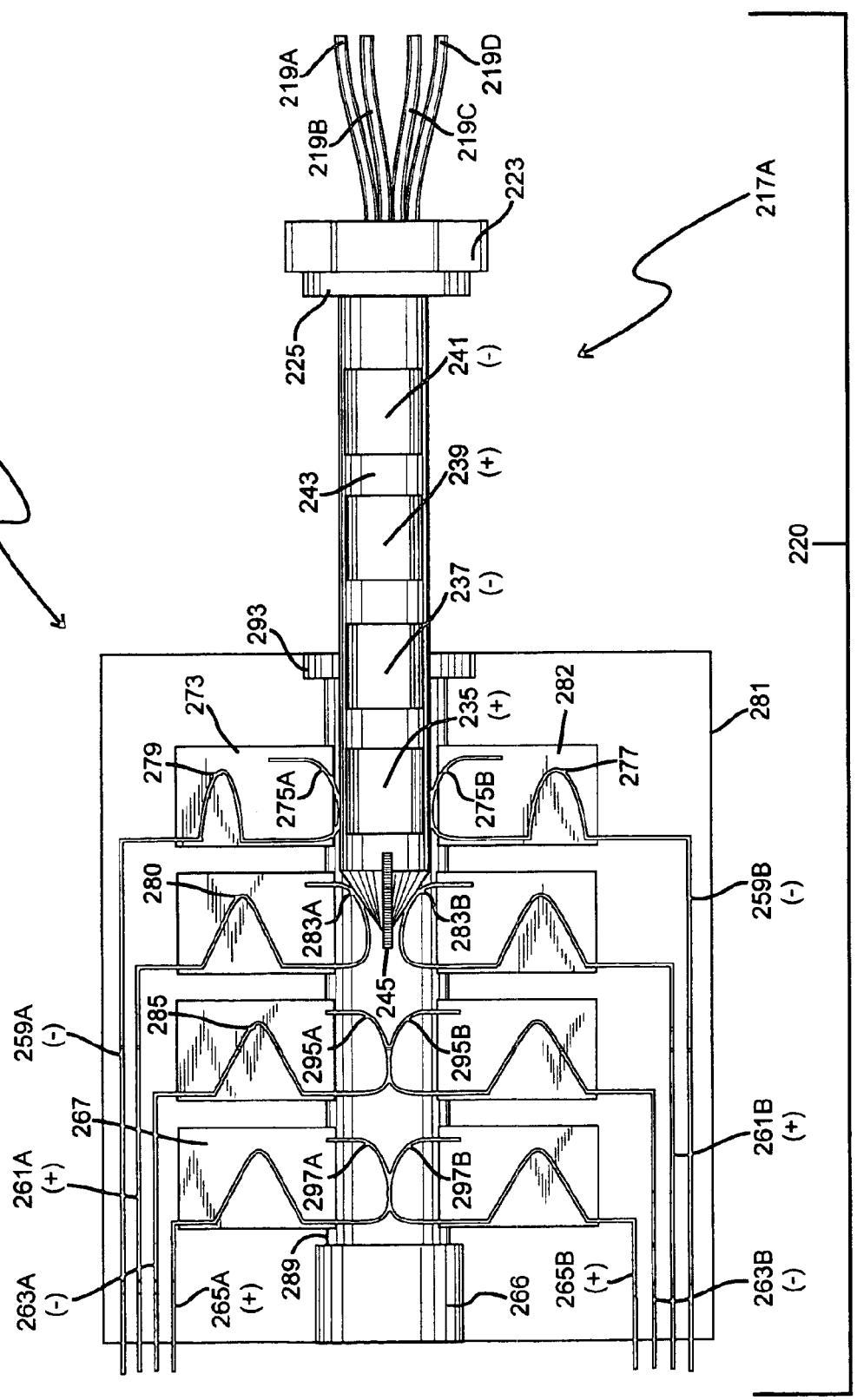
FIG. 6 is a cross-sectional view of a multi-contact receptacle as shown in FIG. 5, depicted here with a mating plug as illustrated in FIGS. 2 and 3 partially inserted.

Connector assemblies of the invention may be integrated into a host device at the time of manufacture. FIGS. 1 and 6 show a multi-contact receptacle 257 that is well suited as a host device's power-input jack.

Upgrades to install a connector receptacle 257, or an equivalent, in an already manufactured host device can be done by qualified field service technicians. Electrical trace conductors would not be in place if the host device was being upgraded, so supplemental wires would be installed, or the circuit board would be replaced. However, the intent of connector assemblies discussed herein is to not have to modify existing host devices, but instead to install the preferred modalities as a female connector in a suitable replaceable module, such as a battery pack.

Connector assemblies discussed in this document, as well as non-limiting referenced alternative modalities, are capable of establishing a "Y-connector" circuit that may interrupt an existing electrical mode of operation. "Key"-type plugs and their mating receptacles (reference FIGS. 5 and 6, as a non-limiting example) provide an automatic reconfiguration of the original circuits when the plug is removed.

Most connector assembly embodiments herein allow for additional features, such as "hot insertions." By the location of a plug's contact pads, or the selection of segments in a barrel- or pin-style plug, staging the electrical contacts is achieved, so that one contact is electrically active prior to a second contact. Strategic placement of insulators in male and female elements of a connector assembly provides circuit disruption, rerouting of electrical paths, and the creation of Y-connector-style electrical branches within circuits.

Multiple operating modes (achieved by rotating the plug to at least one more position) create operations similar to a multi-selector switch. Monitoring a host device's subsystem can be done by rotating a plug to a selectable position, for example. Each branch of a Y-connector (or both together) can be used as either data or power paths, or as combined mixed-signal circuits.

Four Variables

Various embodiments of a connector assembly of the present invention are configured differently, based on the following four generic variables.

First Variable

The first variable is the specific function of any external devices. Intended external peripherals, and their uses, determine the electrical contact configuration and wiring of a connector assembly. For example, if there are two external devices, the first functioning as a battery charger, and the second as a power supply, the routing of power signals through the male and female connector contacts must be specific to both charging a battery, and powering a host device. If the external battery-charging peripheral is to operate independently of the power supply device, then a connector assembly should be used which has at least three contact segments. There can be two discrete and physically interchangeable two-conductor plugs, with the charger device using the first and second of the three contact segments at the receptacle, while the power supply peripheral accesses the second and third receptacle contacts.

Since the primary—but not the only—application of the connector assembly is for battery-powered devices, a shared ground signal is viable because both the battery and host device operate within a compatible voltage and current range, and as long as any attached peripheral is connected to ensure correct polarity.

Figure 7A:
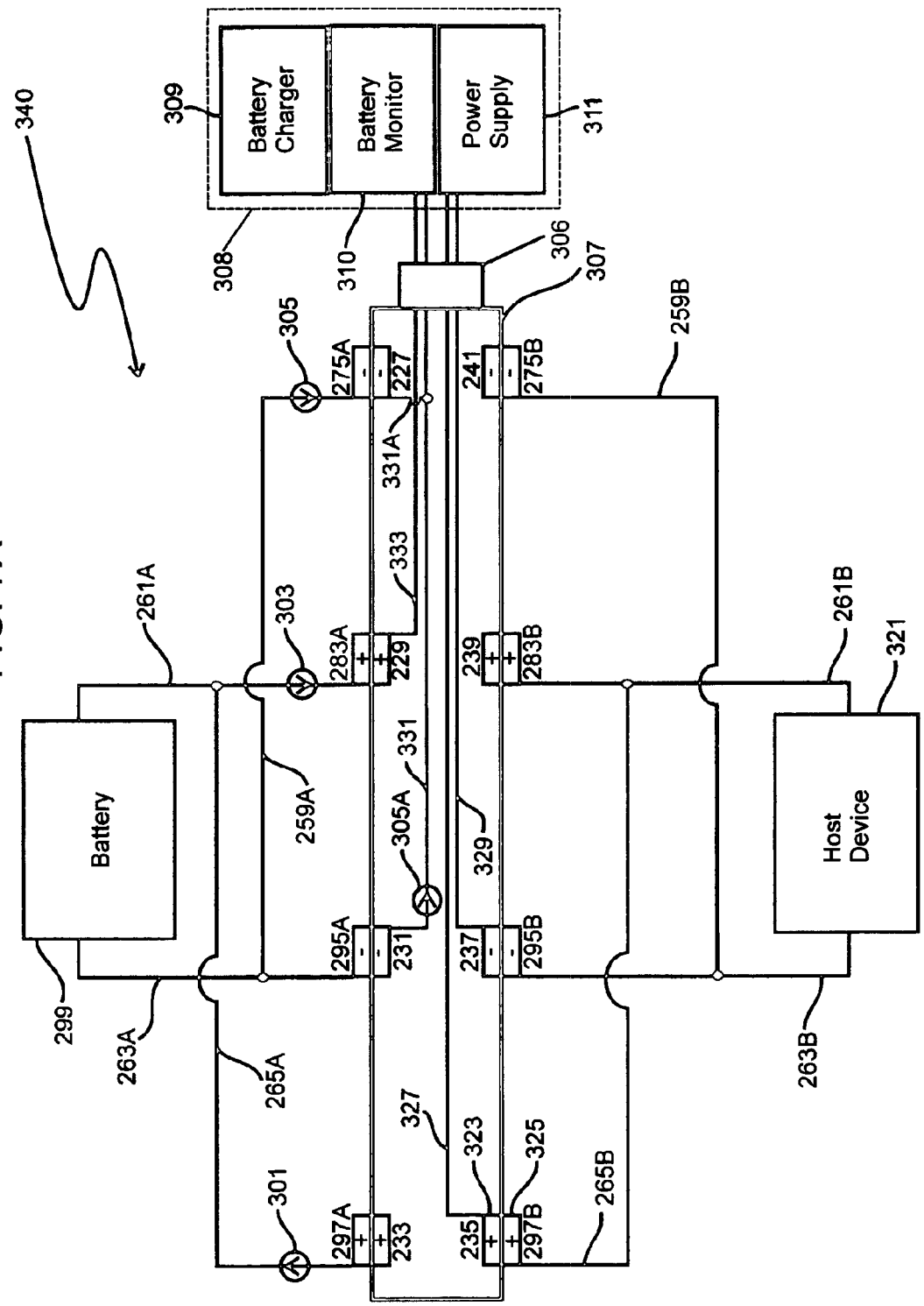
FIG. 7A is a generic block diagram depicting a host device and its associated battery power source that are wired through a connector assembly such as that illustrated in FIG. 6, with a positionable plug in a first position so that external devices capable of charging a battery, monitoring a battery, and powering a host device, each being capable of operating independently and simultaneously.

Thus, instead of two discrete interchangeable connector plugs, a connector assembly that is reconfigurable by rotating a "key" to two discrete positions is employed. FIGS. 7A and B show such a two-position connector apparatus, wherein a first position (FIG. 7A) of a rotating key addresses battery 299 in a "read-only" mode, while a second position (FIG. 7B) of a rotating key addresses battery 299 with a circuit that allows battery charging.

If a battery charging, as well as providing power to a host device, functions are to be performed simultaneously, then a four-segmented connector assembly that has a "Y-connector" capability is called for. If a positionable key connector approach is taken, a single rotation of the key should cause the two circuits—battery charging and delivering power to a host device—to be engaged at one position of the rotating key. The wiring schema in FIG. 7B is appropriate for simultaneous battery charging and delivering power to a host device, so the circuits required in FIG. 7A to perform a battery read-only mode would not be required.

A four-conductor cable between one or more external peripherals, in conjunction with a four-segmented plug, provides two simultaneous independent functions. FIGS. 7A and B, and the related text, describe at least one method of enabling two external devices to perform more than two functions. By the use of an insulator area along plug 307 shown in FIG. 7A as a contact location only 233, power from an external power supply 311 is delivered to a host device 321, without the power signal from power supply 311 flowing into battery 299. Yet battery 299 is still active, should plug 307 be retracted, as receptacle contacts 297A and B (as are 295A and B, 283A and B, and 275A and B) are an opposing pair of spring-loaded contacts. Power from battery 299 would flow through these self-closing contacts to deliver power to host device 321.

The functions a connector assembly of the invention perform are not necessarily the receiving or sending of an electrical signal. A disruption of an electrical path is a function, so eliminating battery charging is considered a valid function, for example. The use of insulators, "Y-connector" branching and redirecting of electrical paths, and various means of making electrical signals flow only in one direction (e.g., diodes, switches, etc.) all combine to optimize the functional capabilities of a connector assembly of the invention.

Second Variable

The second variable in configuring different embodiments of a connector assembly of the present invention relates to the number of contact pads of a plug and mating receptacle). One of the differentiators between a connector assembly of the invention and other connector apparatuses is a capability to create new circuits with a minimum of connector contacts. For example, FIGS. 7A and B depict a simple connector plug 307. In one of these connector assembly's embodiments, rotating the plug creates two electrical paths, because opposing an active contact pad 235 is an insulator (shown diagrammatically as a conductor-less contact 233, by actually an exposed area of the plugs insulated shaft. This insulator disables a branch of a "Y-connector" (spring-loaded and self-closing contact 297A, then conductor 301 and 261A to battery 299 that exists in the mating receptacle). Thus, in a first position of the plug 307, both the battery 299 is accessed (but not charged) and the host device 321 is powered. FIG. 7B also delivers two functions: charging battery 299, and continuing to power host device 321.

An alternative modality of this connector assembly in FIGS. 7A and B uses simple diodes (or equivalents) to direct the flow of electrical signals. Note that diodes 301, 303, 305 and 305A can be incorporated in a plug, or in the circuits associated with the receptacle.

Opposing plug contact pads can be shared. A jumpered conductor 231A electrically attaches contact pads 227 and 231 together along a single shared conductor. FIGS. 7A and B show the purpose of such jumpered contact pads, injunction with means of controlling the direction of signal flow 305 and 305A.

While such a jumpering of two polarity-matched electrical contacts may seem somewhat obvious—even to the point of questioning why the connector assembly in FIGS. 7A and B weren't configured with a single shared negative-polarity contact (thus resulting in a three-conductor circuit)—the multiple functions of various interconnected devices can preclude such a three-conductor arrangement. Thus, comparing FIG. 7A to FIG. 7B, jumpered conductor 331A is essential to delivering power to host device 321 in FIG. 7B because, without the jumper, diode 305A would prevent power from reaching conductor 263B at host device 321.

In summary, a jumpered conductor performs the function of electrically coupling a battery and its associated host device when external peripherals—here a battery charger and power supply—are interposed by a connector apparatus into a circuit that previously coupled the battery and its host device.

Depending on the function to be achieved, a connector assembly of the invention can function with no conductive contact elements at all. For example, if the anticipated function is to disable battery charging, a plug 217 (A, B, or C) in FIGS. 2–4B achieve that capability by having no conductive contact pads engaged to any opposing receptacle contacts. The shaft 243 of these plugs is an insulator, so that when the plug is inserted and prior to any axial rotation, spring-loaded contacts 297A and B, 295A and B, 283A and B, as well as 275A and B are all engaged to the insulated surface of the plug shaft. This electrically disrupts the battery-to-host device circuit.

The role of insulators plays an important part of the operation of a connector assembly of the invention. By inserting an insulator where mating contacts had originally been, the un-attached contact becomes available to use as a terminus for a branch of a Y-connector. Manipulating the available contacts and insulators results in new interfaces between a battery and its host device, whereby selective (and even simultaneous) access to the battery and/or host device is independently achieved. Where such insulators are placed, and the number of them, is not limited to the examples shown in the Figures, and in the text of this document.

The simplest battery packs have two contacts, but more sophisticated battery packs can have multiple discrete connector contacts, some of which are for power, and others for data "Smart" battery connector contact configurations typically have three data lines, and two power lines, but only four lines are minimally required A multi-contact plug, such as that shown in FIGS. 2–4B, and 6, supports both power and data functions.

The use of insulators in mixed-signal embodiments of a connector assembly applies to disrupting data lines, as well as power. For example, disrupting either the Clock (C) or Data (D) line of a smart battery can be just as effective a means of temporarily disabling battery charging as is causing a power signal to be disrupted.

Third Variable

The third variable that determines the configuration of a connector assembly and its related wiring is employing a means of controlling the direction of electrical flow to minimize the number of contacts in the battery-to-host circuit. Typically, a convenient way to minimize the number of contacts/conductors in a connector assembly is to incorporate a means of controlling the direction of signal flow, primarily diodes and switches.

Another advantage of using switches and diodes is that multiple external peripherals can co-exist in the same circuit created by the connector assembly. An N-signal switch, which is activated by the presence of an electrical signal at the input side of the switch, provides a means of accessing an external monitoring peripheral. It is desirable to have a battery-monitoring peripheral accessible to more than one other peripheral in the circuit, because the invention relies heavily on acquiring battery information. An N-signal switch helps selectively interconnect a battery and/or a host device.

For example, by using an N-signal switch, both an external power supply and an external battery charger peripheral access the monitoring peripheral in order to acquire battery (or host device) information. The power supply accesses battery power-output information available at the monitoring device, in order to configure its output signal to the host device. On the other hand, the battery charger accesses the same monitoring peripheral for battery-charging information in order to deliver an appropriate charging signal to the battery.

Fourth Variable

The fourth variable is where in the battery-to-host device's power circuitry a connector assembly is installed. A receptacle may be located in a user-accessible area of a host device, to serve as a primary power-input jack. Where the circuit between a power source (external to, or internal to a host device) and associated devices is modified by the inclusion of a receptacle into an existing circuit is not limited to only within a battery housing. Most any of the embodiments of a receptacle herein can be relocated outside a battery housing. A major advantage of locating a connector receptacle in a battery pack is that it affords a simple user-upgrade for existing host devices, by just removing the present battery pack and replacing it with one that has been upgraded with a receptacle of the invention.

"Key" Connector

A connector assembly 220 (FIGS. 1 and 6) of the invention is a positionable "key-style" connector, which incorporates an insulator (and/or other elements, such as diodes) and various electrical contacts into a plug and its mating receptacle. While a "key" plug 217A (FIG. 6) can rotate in order to provide multiple interconnections among a plurality of devices and/or peripherals, the plug does not necessarily have to rotate in order to result in a new circuit. The insertion or retraction of a plug, each in itself, causes an existing circuit to be modified. Thus, connector assembly 220 uses an insertion, rotation, and/or retraction of a plug to result in various circuits based on the placement and interactions of a plugs and/or receptacle's electrical contact(s) or insulator (s) to electrically coupling or uncoupling.

In my U.S. Pat. No. 6,634,896, "Method and Apparatus for Transferring Electrical Signals Among Electrical Devices" (21 Oct. 2003), a key connector 330, for example, in FIG. 20, is removed, rotated then reinserted. Connector 330 in FIG. 20 is both aligning its conductive contact 340 to either mating receptacle contact 378, or 374, thereby activating one of two electrical paths of a Y-connector. At the same time, insulator 344 is deactivating the opposing branch of the Y-connector.

Also in the same Patent, receptacle 414 in FIG. 21A incorporates a means of controlling the direction of electrical flow. A diode 423 allows power to flow in a direction only from a battery source to an attached peripheral 413. However, power cannot flow in the direction of battery, so that a power signal from either a host system, or an external power source, cannot travel a path to the battery while a plug is in a selected position. Once the plug is removed, as shown in FIG. 21B of the issued US Patent, power to a battery 413 can flow across spring contact beams 419 and 417, bypassing diode 423. Diode 423 in FIGS. 21A and B is equivalent to means of controlling the direction of electrical flow 301, 303, 305, and 305A in FIGS. 7A and B of the apparatus presented here.

Spring-tensioned contacts at a receptacle (see FIGS. 1, and 5–7B) are used with key-type plugs to avoid the use of discrete "jumper" plugs or terminating blocks to re-establish a circuit between devices that is temporarily disrupted when a plug is inserted. Here, no jumper plug is required, as the receptacle's self-closing spring-loaded contacts return all disrupted circuits to their normal state. The spring-loaded contacts also serve a secondary purpose, as the tension of the receptacle contacts help to hold the inserted plug in place and to control inadvertent plug rotation. As can be seen in FIGS. 2–4A, the plugs insulated shaft 243 is rectangular in cross section, so that the spring tension of the receptacle's self-opposing contacts are directed against flat surfaces of the plug. The corners of the shaft are slightly rounded, to facilitate rotation and to minimize any potential over-compression of the receptacle's spring contacts that might result in loss of electrical recoupling of these contacts with repeated usages over time. The number of flat surfaces of a plug's shaft are not limited to four, and shaft cross-section profiles that provide multiple flat spots (e.g., octagonal) are certainly within the scope of a connector assembly 220 (FIGS. 1 and 6).

Figure 2:
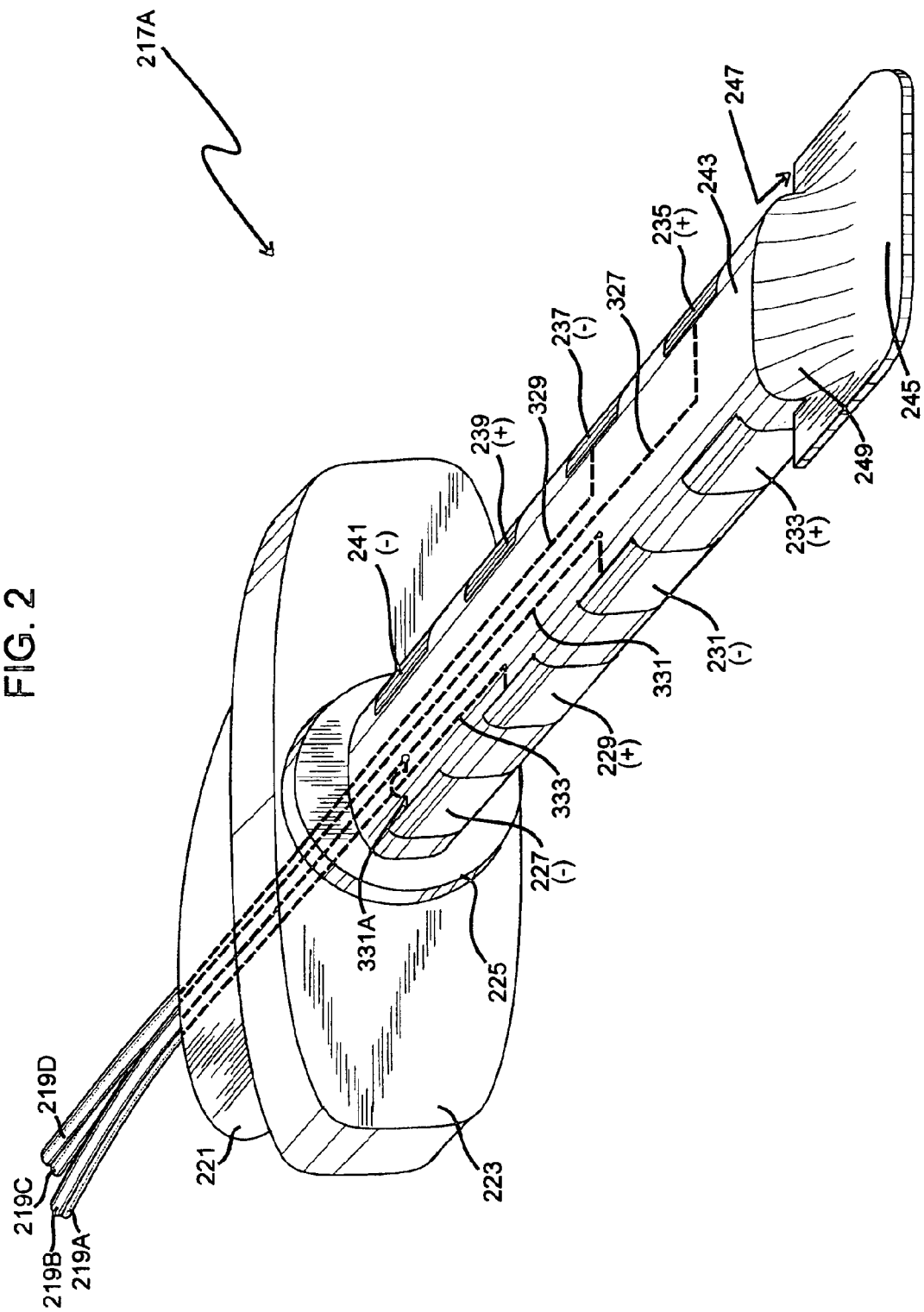
FIG. 2 is a detailed view of one of the embodiments of the multi-contact plug shown in FIG. 1 which has an alignment element that also prevents the plug from disengaging once it is inserted and which also can be configured to provide security "key" functions.
Figure 4A:
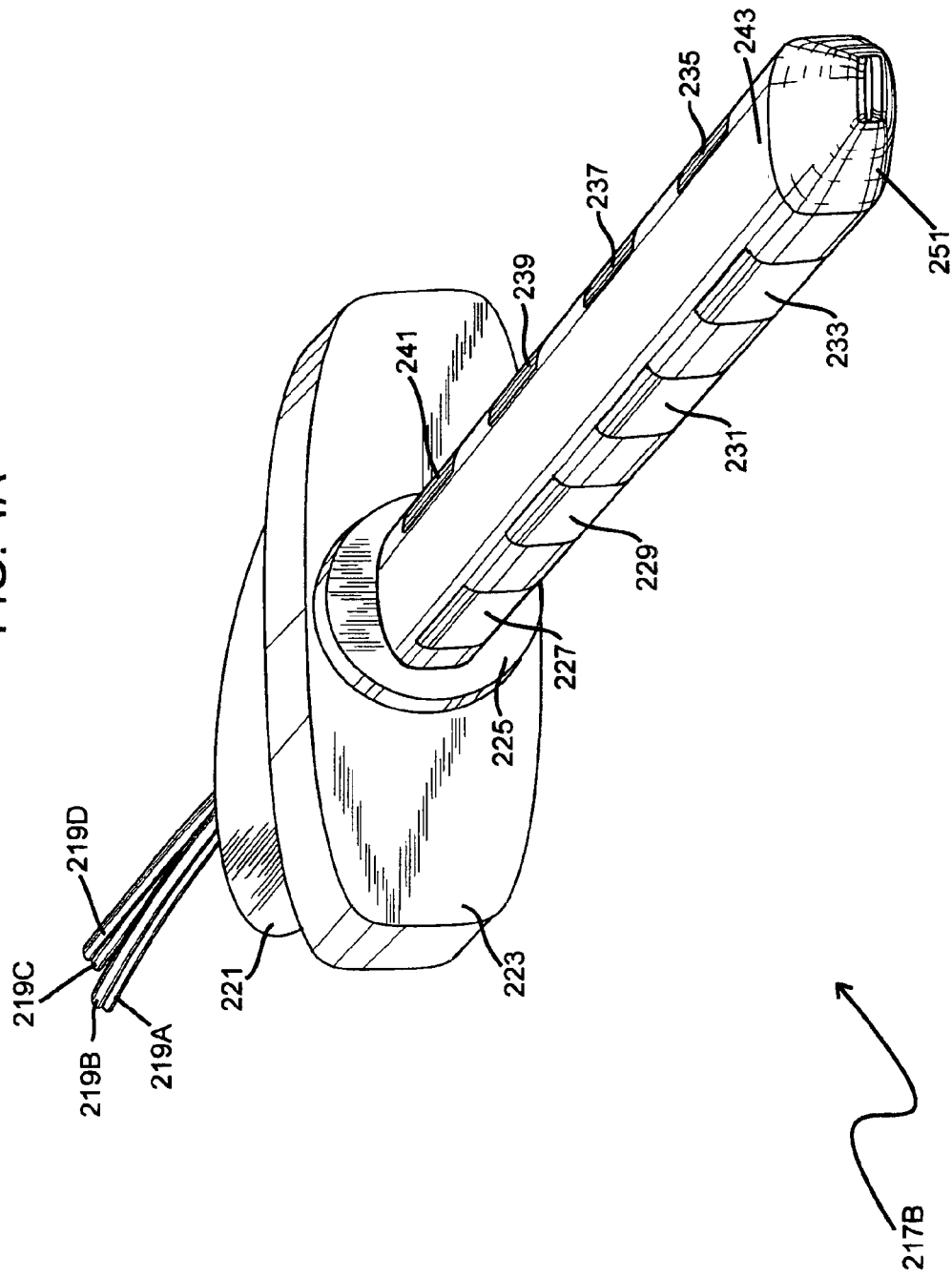
FIG. 4A depicts a multi-contact plug similar to that in FIGS. 2, and 3, showing a different tip configuration.

FIGS. 1–3 show a plug 217A including equivalents 217B and C in FIGS. 4A and B configured to physically resemble a key. A "key" plug 217A is designed to be inserted into a receptacle 257 having opposing contacts (FIG. 5 as 275A and B, and FIG. 6 as 275A and B, 283A and B, 295A and B, and 297A and B) then—in most connector operations—the plug is axially rotated. Contacts within receptacle 257 are pre-tensioned to be self-closing, so that a closed circuit between, for example, a battery pack and its host device is automatically re-established when a "key" plug is retracted.

While four pairs of opposing receptacle contacts are represented in the Figures, the connector assembly of the invention is not limited in the number of such contacts, nor in their opposing positioning. In a non-limiting example, a receptacle having only one pair of opposing contacts has a first mating position wherein the first receptacle contact engages a first contact pad of a mating plug then, upon rotating the plug to its second position, the second receptacle contact engages the first contact pad of the plug. In such a modality, the plug's second contact pad is positioned to not align with the previous pair of receptacle contacts. Instead, the second contact pad engages a single non-opposing receptacle contact. The single receptacle contact is positioned along a conductor that is shared by two devices (e.g., a common ground line). FIG. 2, for example, shows a spade-type tip 245 which can be conductive, and which would serve to attach to the single receptacle contact discussed here. In an application where a shared electrical ground is practical, plug 217A can be built with only three segments, one of which is a shared ground, as would be the case with any battery-powered host device, since both devices are inherently voltage-, current-, and polarity-compatible.

Figure 5:
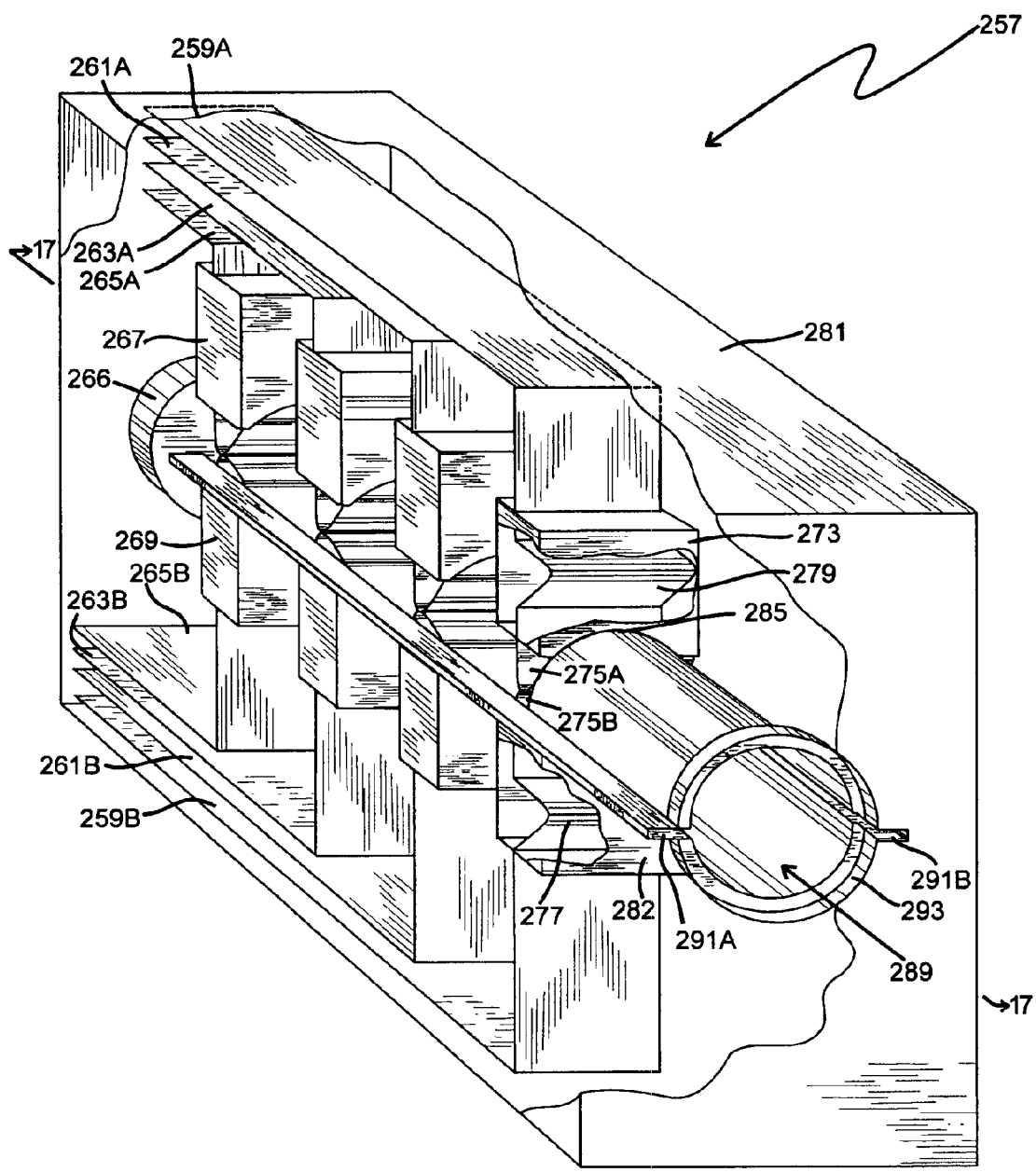
FIG. 5 depicts the internal elements of a multi-contact receptacle, including self-closing spring contacts that re-establish original circuits when a mating plug shown in FIGS. 2 and 3 is removed.

FIGS. 2 and 3 illustrate a male "key"217A. A "spade-type" tip 245 affords a method of keeping key shaft 243 aligned during insertion and removal from a receptacle 257 (FIG. 5). Squared back edges 247 of spade tip 245 keep key 217A from being pulled out accidentally, once it is rotated within its receptacle 257. A cylindrical cavity 266 (FIGS. 5 and 6) captures plug spade tip 245.

Shared power contact pads are practical in some applications, so that the positive (or negative) polarity conductors of a battery, an external device, and a host device can, under certain conditions, be shared. This helps to minimize the number of contact pads required, and is practical most anytime a battery and host device operate at the same voltage, polarity, and current levels. The limitation is that the power of all inter-connected external peripherals must also be compatible with the power-input requirements of both the battery and host device. Various interconnected devices can preclude such a shared contact pad arrangement. A connected charger peripheral is likely to operate at significantly different (usually higher) voltages and at different current-levels than a power supply peripheral. Even more to the point, if the charger is a pulse-type, it will continuously flip-flop polarity during the charging cycle.

Like a key in a lock, plug 217A (in FIG. 6, for example), rotates and usually (but not always) operates in at least two distinct positions. FIG. 7A diagrammatically shows a first position of such a plug as element 307, wherein a host device 321 is accessible for being powered by an external power supply peripheral 311 and, at the same time, a battery 299 is accessible for being monitored by an external battery-monitoring peripheral 310.

When a plug 307 is rotated to its second position, as shown in FIG. 7B, host device 321 is still accessing power supply 311 (albeit by a different set of plug and receptacle contacts) and battery 299 is, instead, now accessing an external charger peripheral 309.

There is a third position of a plug 217A, which is depicted in FIG. 6. When the plug is fully inserted into its mating receptacle 257, all receptacle spring-contact pairs 297A/B, 295A/B, 283A/B, and 275A/B are electrically disrupted by plug 217A's insulated shaft 243. So, by inserting such a plug, and prior to any rotation thereof, a full-OFF (open-circuit) state in all of the electrical circuits of receptacle 257 is achieved. Thus, the plug of a connector assembly 220 may be used as an effective ON/OFF switch, with its inserted position causing only an insulator to be attached to previously electrically coupled receptacle contact pairs resulting in altering electrical paths.

In actuality, should a designer or manufacturer of connector assemblies 220 (FIGS. 1 and 6) require a very low cost means of only disrupting (i.e., a non-rotate-able plug insertion causes an OFF state in at least one attached device) conductive paths in a receptacle 257, then a plug comprised of only an insulated shaft—no contacts or conductors—is a simple, low-cost solution. Note that, depending on the configuration of conductors (e.g., 259A and B, 261A and B, 263A and B, and 265A and B) attached to the available receptacle contacts, as they are routed to various interconnected devices and/or peripherals, any plug configuration need not disengage more than one pair of spring-loaded receptacle contacts in order to achieve a desired function.

"Key" Features

FIGS. 2–4B show non-limiting examples of a "key-style" plug. The primary differentiator between "key" plugs 217 (A, B, and C) is the mechanical method of spreading the pre-tensioned contacts in a mating receptacle 257 in FIGS. 1, 5 and 6. A "spade-shaped" tip 245 is shown in the two views of the plug 217A in FIGS. 2 and 3. Side strakes 247 of the tip afford an alignment of the plug when inserted into a keyway 291A and B of receptacle 257 (FIG. 5). Squared-off back edges of strakes 247 latch into a circular chamber 266 to capture the plug tip 245 and 243 (FIGS. 2, 3, and 4B respectively) and prevent the plug from retracting. The generally-elongated shape of a plug knob 223 allows for quick user-recognition of the plug's rotational position. The left and right ends of knob 223 can be color coded, or labeled with indicia as in FIG. 3, to indicate the plug position's selected function such as "Battery Charge," or "Host Power," for example. A disk 225 at the base of plug shaft 243 in FIGS. 2, 3, and 6 ensures that the rotation of the key is along its centerline longitudinal axis. When the plug is fully inserted, disk 225 seats in a mating recess 293 in receptacle 257.

FIG. 4A depicts a plug 217B with no latching provision at its tip. In this embodiment, the spring tension of paired contacts 297A/B, 259A/B, 283A/B, and 275A/B in receptacle 257 (see FIG. 6) are relied on to constrain the inserted plug 217B. An additional means of increasing receptacle contact tensioning is shown in FIG. 6, as compressible "scissor bends" or kinks 285, 280, 277, and 279 in the contact beams. To resist unwanted fore and aft movement of respective contacts 295A, 283A, 277A, and 275B during plug insertion and retraction, the scissor bends are each captured within a cavity of the receptacle. FIG. 6 illustrates these cavities 267, with cavity 273 showing compressed scissor bend 279. Because shaft 243 of the plug is wider than its height (thickness, as referenced in FIGS. 4A and B), rotating the plug to engage its contacts to the receptacle contacts creates even further compression of the spring-tensioned receptacle contacts, thus causing increased plug constraint, as well as enhancing electrical coupling between mating plug and receptacle contacts.

Dimensionally, shaft 243 can be expressed in a number of embodiments. A flat, thin non-conductive "blade" with electrical contact pads equivalent to 227, 229, 231, 233, 235, 237, 239 and 241 of FIGS. 2 and 3 is viable. Being a flat blade, the eight contacts would be placed on the top and bottom surfaces (not shown). Just as in the previous description of a plug that is totally non-conductive, such a described thin, flat plug would not rotate once inserted into a mating receptacle. If a second position is desired from a flat plug having top and bottom contacts, a user would retract the plug, rotate it to a selectable second position, then reinsert the plug (see my U.S. Pat. No. 6,634,896 "Method and Apparatus for Transferring Electrical Signals Among Electrical Devices," (28 Oct. 2003) for examples of blade-style plugs that require insertion, retraction, rotation, then reinsertion). For a plug shaft 243 that is intended to rotate within its mating receptacle, the cross-section profile can be, without being limited to, round, oval, square, or multi-sided (six sides, eight sides, etc.).

Plug shaft 243 (FIG. 2 and elsewhere) is composed of non-conductive material. The number of contact pads on a plug is determined by the desired function, such as battery charging, delivering power to a host device, etc., as well as whether or not the desired functions are to be performed serially, or simultaneously. FIGS. 2 and 3 show a plug 217A with eight contact pads, because simultaneous access to a battery pack and a host device typically requires four plug contact pads each, as configured in diagrams 18A and B, wherein three external peripherals (battery charger, battery monitor, and power supply) are selectively simultaneously available to either—or both—a battery and/or a host device.

For a mixed-signal application, such as both data and power for a "smart" battery and its host device, eight plug contact pads would be allocated: four contact pads for smart battery use (two for power, and two for data), and four contact pads for power, and also data to a host device (two contacts for power, and two for data). This connector assembly configuration assumes either a Dallas One-Wire protocol, or a modified SMBus protocol using only the Data (D) and Clock (C) data lines.

The spacing of contact pads 227, 229, 231, 233, 235, 237, 239 and 241 in FIGS. 2 and 3 is determined by the spacing between the mating tensioned contacts in receptacle 257 (see FIGS. 5 and 6).

Variations of number of contacts, contact arrangement on plugs and/or receptacles, keyways, key knobs, plug shaft tips, and other physical features, are not limited in any way to the configurations shown or discussed here.

Self-Closing Spring Contacts

FIGS. 5 and 6 show a generic receptacle 257, here configured to be compatible with a "key" plug 217A in FIGS. 2 and 3. The electromechanical action of receptacle contact pair 275A and B is by the controlled upward and downward movement of scissor springs 277 and 279, causing each of the paired contacts to be more reliable when self-closing. Each of the eight scissor springs allows its associated contact to electrically couple with an opposing paired contact (275A and 275B in this example) when a plug 217A is retracted. When all eight spring contacts mechanically return to their electrically closed positions, receptacle 257 is then automatically reconfigured to be electrically "transparent" in a circuit, i.e., all electrical signals travel along circuit paths as if receptacle 257 isn't present.

Receptacle spring-loaded contact 275A or 275B (as representative of the other six contacts) in FIGS. 5 and 6, are kept in opposing alignment by retaining cavities 273 and 282 respectively (as representative of the other six cavities). These cavities restrain lateral and fore/aft movement of contacts 275A and 275B. Note that the bottom face of each of the eight retaining cavities have curved fore and aft lower edges 285 (FIG. 5) that provide clearance for inserting the shaft 243 of a plug 217A (FIGS. 2 and 3), as well as unobstructed space to allow for the plug's rotation. The longitudinal alignment of these curved edges 285 is part of a circular "tunnel" 289 that runs the length of receptacle 257, as seen in cross-sectional view 17—17 (FIGS. 5 and 6). Tunnel 289 terminates in a circular chamber 266. This chamber has a circumference large enough to clear the rotational sweep of spade tip 245 of plug 217A (FIGS. 2 and 3). A keyway 291A and B in FIG. 5 keeps side strakes 247 of spade tip 245 aligned as shaft 245 of plug 217A travels along receptacle tunnel 289.

FIG. 6 illustrates a cross-sectional view 17—17 of a receptacle 257 in FIG. 5. Plug 217A is shown partially inserted into tunnel 289, and self-closing contact pair 275A and B are already electrically uncoupled. Contacts 275A and B are fully retracted into their respective retaining cavities 273 and 282, which keep the contacts from distorting or moving out of opposing alignment with each other. Scissor springs 279 and 277 provide compression. Scissor springs fashioned from flat conductors as shown here are not the only way to increase opposing tension for contacts 275A and B, and an equivalent compression means is acceptable.

As a tensioning element, the amount of compression scissor springs 277 and 279 in FIG. 6 must provide is determined in part by the vertical thickness of shaft 243 of a plug 217A. The cross-sectional thickness-to-width ratio of shaft 243 determines the amount of extension and compression travel scissor springs 277 and 279 must provide. The inter-related cross-sectional dimensions of shaft 243's thickness and width, along with the spring tension at scissor springs 277 and 279, determine the amount of force required for a user to rotate a plug 217A once it is fully inserted. For a given shaft width, a plug with less thickness will insert with less force, but such a plug will require greater rotational force. Also larger bends in scissor springs 277 and 279 will reduce insertion force, but at some potential loss of positive and accurate contact closure action (and the height of a receptacle 257 will likely increase to accommodate the larger scissor springs). As a design consideration, sufficient shaft thickness is needed to provide surface area for mounting plug contact pads 235, 237, 239 and 241 (FIG. 6), and enough thickness to house related plug's internal conductors 327, 329, 331, 333, and shunt 331A for cable wires 219A–D.

Plug contact pad size is determined by a requirement for electrically conducting certain power levels at acceptable contact temperatures. The spacing, size, and location of contact pads 227, 229, 231, 233, 235, 237, 239, 241 (or equivalents) on a plugs insulated shaft 243 (FIGS. 2–4B) are not limited. Contact pads can be on any exposed face of shaft 243. Contact pads do not all have to be aligned along the same face, or on opposite faces of the shaft. Non-opposing faces can be utilized. For example, there can be contact pads on the top (and/or bottom) faces of a shaft 243 that close a circuit upon plug insertion, while further contacts on the sides of the shaft serve to close circuit(s) when "key" plug 217A (FIGS. 5 and 6) is rotated a quarter turn (assuming that shaft 243 has four sides). Other locations for placing contact pads can exist at the shaft tip, e.g., tip 251 of shaft 243 in FIG. 4A can be conductive, with a mating receptacle contact located in circular chamber 266 (FIGS. 5 and 6).

Paired receptacle conductors 259A and B, 261A and B, 263A and B, and 265A and B in FIGS. 5 and 6 are expressed here as flat blades that terminate at or slightly beyond the aft face of receptacle 257's housing 281.

Any dimensional considerations or proportions indicated or suggested by any of the figures presented herein should only be interpreted as relative sizes of parts or sub-assemblies. Actual size, shape, and proportions may differ depending on specific applications and implementations. So, too, will there be variations in keyways, retaining mechanisms, insertion systems, and plug or receptacle contact shapes and locations.

A reasonable mounting location for a receptacle 257 in an existing battery housing is in the longitudinal "valley" created by two adjacent cylindrical cells. It may be that the orientation of a receptacle 257 is at 90-degrees (rotated longitudinally) to that shown in FIG. 6, so that the spring contact pads are oriented horizontally, instead of vertically. In battery packs which have yet to be designed, the depicted rectangular configuration of a receptacle 257 would best be served by allowing space for the connector element to occupy some part of the full height of the battery enclosure. The space issue is less problematic if receptacle 257 is installed in a host device, e.g., laptop computer, as its primary input power jack.

If a receptacle is to be mounted in a battery pack, attention should be paid to the width of the plug knob 223 (FIG. 2). It is undesirable to have the ends of the knob protrude above or below the thickness (height) of the battery housing when the plug is rotated. In such installations, the size and shape of knob 223 will be space- and clearance-driven.

A Security "Key"

A plug's finger hold 221 in FIGS. 2 and 3 can be a flange (or backshell) on a power/data cord. Flange 221 is removable, and is insertable into a sub-assembly that comprises plug knob (handle) 223 and its shaft 243 as a mating element. Thus, the entire shaft and knob sub-assembly is removable by disconnecting it from "mate-able" flange 221. By making shaft-knob elements of plug 217A detachable and interchangeable, a common shared power/data cord is used, and various shaft-knob sub-assemblies can be employed to provide flexibility in connecting with a variety of devices.

Further, unique shaft-knob sub-assemblies can be designed and manufactured to configurations that properly mate to only one specific device . . . a true "key" situation that brings a security advantage to the connector assembly of the invention. Such a security-access key connector can be used in situations, for example, where there is a need to have limited user access to computers or other electronic equipment. Without the right security key to connect external power (and/or data) to a host device's power circuitry, a host device (a computer, for example) cannot be turned on.

Other applications of security keys can limit in what mode or power-configuration host devices (and their rechargeable battery packs) are able to operate. An example of a restricted mode of operation for a host device (with its internal battery pack) is a laptop computer (or equivalent device) that can only be used on a commercial aircraft if its battery pack is not being charged. Configuring a restricted-use detachable plug shaft, by its physical configuration (shape, size, number and placement of contact pads, etc.) and the wiring of the plug and receptacle, automatically renders the battery pack charging circuit inoperative when such a "security key" plug is inserted into an onboard receptacle supplied by the airline. This ensures passenger safety by eliminating the known risks associated with battery-charging volatility.

To continue this example of a no-battery-charging connector assembly, the diagrammatic circuit illustrated in FIG. 7A as connector assembly 340 prohibits signal inputs to a battery 299, while permitting signal outputs from battery 299 to an attached external peripheral, such as a battery monitoring device 310. A negative-polarity power signal output from battery 299 travels along conductors 263A, then along 259A to both receptacle contacts 295A and 275A, while a positive-polarity battery signal is output along conductor 261A to receptacle contact 283A.

"Security key" plug 307 in FIG. 7A continues the conductive path from battery 299 by coupling its contact pads 231 and 227 to receptacle contacts 295A and 275A respectively, thus enabling plug conductor 331 to deliver the negative-polarity signal to battery monitor 310 along conductor 331. Note that a jumpered conductor 331A couples plug contact pad 227 to primary conductor 331. Plug contact pad 229 electrically couples to receptacle contact 283A for transferring the positive-polarity battery signal from receptacle contact 283A to plug conductor 333 for delivery to battery monitor 310.

Input signals to battery 299 are blocked by elements 303, 305, and 305A, which serve to control the direction of signal flow along a unidirectional conductive path from the battery to any available external peripherals. Elements 303, 305, and 305A can be diodes, switches, or any equivalent means of controlling the direction of an analog signal. Thus, even if a user attaches a battery charger 309 to connector assembly 340, the charger's signal cannot travel to battery 299.

The placement in plug 307 of an element 305A that controls the direction of signal flow adds security to the male "key" component of the connector assembly, affording added protection against battery charging. Since the receptacle contacts and conductors recited above would likely be incorporated into the battery pack of a battery 299 (FIG. 7A), hypothetically a user could modify the battery by incorporating elements 301, 303, and 305 for controlling the direction of signal flow into existing circuits to eliminate the protection against battery charging provided by elements 303 and 305. But, even without elements 303 and 305 present, the means of controlling the direction of signal flow 305A incorporated into plug 308, by itself, still blocks any signals generated by an external charger 309 from reaching battery 299.

In its implementation on an aircraft, the security key plug 307 (FIG. 7A) is provided to passengers by the airline, thus allowing the airline to control the safety of any passenger-provided host devices 321. Plug 307 can be located at the terminus of the power-output cable of an external AC/DC or DC/DC power-conversion adapter that a passenger brings on board the plane. As previously discussed, making shaft 243 and knob 223 a sub-assembly of plug 217A (FIGS. 2 and 3) that is detachable and interchangeable enables designers and manufacturers of power conversion adapters to provide a common shared power/data cord interface (219A, B, and C) so that the regularly-supplied plug for delivering power to a host device and battery charging can be replaced during in-flight operations with the security key plug 307 in FIG. 7A.

Such a simple implementation of airline battery safety also means that passengers do not have to purchase new laptop computers or other mobile electronic devices, but only install a battery pack incorporating a receptacle 257 (FIG. 6) that is compatible with security key plug 307 of FIG. 7A.

It is possible to designate a specific position in a rotateable version of a plug 307 as an alternative implementation a connector assembly 340 (FIG. 7A) for airline battery safety, so that the circuit shown in FIG. 7B is conveniently available in situations where battery charging is allowed. Whichever approach is taken, a host device and its battery can operate in unique modes that provide previously undiscovered security and safety through the use of a plug 307 as a "security key."

Design Considerations

In designing and fabricating plug contact pads and mating receptacle spring contacts, the current-carrying capability of the conductive materials should be sufficient to handle the power required by a host device. With laptop computers, for example, 50-Watts is not uncommon. The "ampacity" rating (at temperature) of contacts, conductors, etc., should be optimized to not cause any power loss. The confined space limitations inside a typical battery pack might well pose potential barriers to using large-surface-area electrical contacts, or the use of heavy-gauge conductors. The use of space-saving flat metal zinc (or nickel-plated zinc) strip conductors is advantageous in routing receptacle powerlines inside a battery enclosure.

If a receptacle is to be integrated into a new battery pack at the design stage, then wiring troughs and space for a receptacle can be pre-planned. Since receptacles can be integrated as retrofits to existing battery packs, the emphasis on selection of conductive materials is an important consideration. For retrofitting existing battery packs which cannot grow dimensionally, remolding the pack's plastic housing to allow for installing a receptacle and creating wiring troughs is a valid approach, but only if production quantities justify the additional cost.

With existing battery packs, additional space inside a pack's housing can sometimes be created by removing older, lower-capacity battery cells, and replacing these with newer, smaller (and perhaps even higher energy-density) ones. Lithium-Ion cells manufactured in 1996, for example, were twice as big, and almost half as energy-dense as Li-Ion cells manufactured in 1998. Older "sub-C"-sized cells and 18 mm cells can be replaced with 17 mm cells, or even 15 mm cells, usually without any trade-offs (and perhaps even improvements) in total pack capacity. Substituting smaller cells creates room for a receptacle and the related wiring, without having to modify the battery pack's plastic enclosure.

Anyone skilled in the art of connector design and fabrication will be able to fit any of the examples of the receptacle of the invention into an existing battery pack.

Polymer Lithium-Ion cells, with their rectangular shape and variable form factors, can also replace existing cylindrical cells in existing battery enclosures. Rectangular cells yield more energy-density per square inch. The unused space left as "valleys" between columns of cylindrical cells can be eliminated by using rectangular polymer cells, thus freeing considerable room (as much as 20% of an existing battery pack's volume) for a receptacle.

A connector assembly comprising a plug 217 (A, B, or C) and a receptacle 257 in FIGS. 1–6 lend themselves to the space limitations of a battery pack Receptacle 257 in FIGS. 5 and 6 looks large as drawn, but it will fit comfortably in most battery housings. The receptacle can be reduced in size by reforming the spring contacts 275A and B and scissor bends 279 and 277 shown in FIGS. 5 and 6.

While not detailed in the figures, those skilled in the art will readily perceive that flat conductors 265A and B, 263A and B, 261A and B, and 259A and B need only be shaped with a first bend at more (or less) than the 90-degrees shown in cross-section 17—17 (FIG. 6). Flat conductor 259A, as a non-limiting example of this alternate design approach, is formed to have a first bend (the first downward bend along the horizontal) of less than 90-degrees. Scissor-spring 279 can thus be eliminated, as the new obtuse angle of the flat conductor now allows the downward-angled beam to flex at the point of the first bend. The new obtuse angle of the beam now allows spring contact 275A to travel in an arc (left-ward and upward as viewed in FIG. 6). The actual arc of travel depends on the specific angle of the beam, and length of the beam from the first bend. On the other hand, if the first bend in flat conductor 259A is at an acute angle, the spring-contact 275A travels in an arc to the right and upward (as viewed in FIG. 6).

Having modified a flat conductor 275A (FIG. 6) with either an acute or obtuse angle, a designer may elect to use a retaining cavity (273 in this example) to electrically isolate spring contact 275A from adjacent contact 283A. With proper intermediate spacing and restraining cavities 273 and 282 between spring contacts, there should be no real risk of any two adjacent contacts electrically interfering with each other.

This alternate modality of conductor shape and angled contacts should result in a reduced height profile of receptacle 257 (FIG. 6), as well as reduced manufacturing cost by eliminating the additional bends of the now-eliminated scissor springs. A possible trade-off is that the loading of the beams will likely need to be increased to compensate for the lack of a scissor-spring mechanism. Increased beam pressure will assure positive self-closing of opposing spring contacts, but at the expense of greater insertion forces and decreased connector life.

How a battery pack inserts into its bay ("cavity") in a host device is a noteworthy consideration when designing this multi-contact connector assembly for battery pack installation. Most battery packs insert end-wise into a battery bay, leaving the face at one end of the pack housing exposed. The receptacle is accessible through an opening along this exposed face of the battery housing. Packs with cylindrical cells typically have their cells stacked end-to-end in columns. A convenient "V" (in the end-view of two adjacent columns of cells) between cell columns is available for installing a receptacle and related conductors. The open end of the receptacle is situated directly behind the pack's housing wall, and an opening in the wall provides access for the plug. With a battery pack thus configured, a user can inter-connect a variety of external devices (peripherals) through this interface. Depending on the wiring schema of the connector assembly, any external peripheral can transfer electrical signals either with a host device, or its battery—even multiple peripherals can concurrently (or simultaneously) access either/both the host and/or its battery.

Occasionally, the orientation of the cell columns in a pack are at 90-degrees to the exposed face of the inserted battery pack housing, making the valley between columns unavailable for receptacle installation. In such situations with existing battery packs, designers should consider replacing the cylindrical cells with smaller ones. As previously discussed, smaller cells may actually have more capacity than those being replaced. Another option is to replace the existing cylindrical cells with polymer ones. This approach will almost certainly bring more pack capacity, while freeing ample room for the connector receptacle. Also Lithium-Ion cells are rated at higher voltages (about double the voltage of a Ni-Cad), which means that fewer total cells are required.

As depicted in FIGS. 2–4B, the connector assembly's plug 217 (A, B, or C) features an elliptical plug knob 223. The elliptical-shape design is intended to assist a user in orienting the plug shaft 243 with the receptacle tunnel 289. The knob's shape is beneficial when aligning the tip's side strakes 247 (FIGS. 1–3 with keyway slots 291A and B (FIG. 5).

Further, in the non-limiting examples of the connector assembly discussed here, plug insertion results in the insulated plug shaft 243 (FIGS. 1–3, and 6) being attached to the receptacle's spring-contact pairs (i.e., all circuits are electrically open). Should a designer require plug insertion to result in at least one closed circuit, the plug's relevant contact pads can be located on the top and bottom of shaft 243.

Returning to the plug knob 223 (FIGS. 2–4B), while the shape and size of the knob is not critical to the proper operation of the invention, a designer should allow clearance all around the access opening in the battery pack for rotation of the inserted plug.

Cables and Muxes

For battery packs that install by first inserting their larger top or bottom surfaces into a battery cavity (instead of sliding an edge face of the pack end-first into a battery bay), the issue of cabling is important. If the battery cavity is located on the bottom face of a host device, such as the underside of a laptop computer, then a round cable exiting from the battery bay beneath the host device is not acceptable. The cable thickness could cause the host device to not sit flush on a flat surface. Since there may not be enough clearance under a host device to route a round cable, then a ribbon cable, or a flat cable built using flexible circuit board techniques, provide the low-profile required in such tight confines. Standard ribbon data cables work fine for power delivery by tying together several of the 28-gauge conductors to provide sufficient conductivity.

As for muxes, FIGS. 1–4B illustrate a modality of a plug of the connector assembly of the present invention that, for example, uses a four-conductor cable for both monitoring a battery, while simultaneously delivering power to a host device. The same functionality can be achieved with fewer than four conductors by incorporating an N-signal switch in the circuit. The N-signal switch operates by switching a pair of power pins on the switch in response to the application of power to the switch.

A switch so configured establishes an attached peripheral with a junction between a battery and a host device, so that a three-branched Y-connection is created. For purposes of this non-limiting example, the switch is at the juncture of the three branches of the "Y." A battery is at the terminus of the first branch of the Y-connection, the host device is at the terminus of the second branch, and a user-selectable peripheral is attached electrically at the terminus of the third branch. In this example, the attached peripheral is a multi-function device that is capable of both receiving electrical signals for monitoring battery power output, and the peripheral also has a variable-output power supply incorporated that is capable of outputting a power signal for powering the host device.

In operation, the switch is configured by a power signal from the battery along the first branch of the Y-connector. The switch is thereby configured to both direct the battery's power signal to the host device along the second branch, and also to direct the same power signal to the peripheral along the third branch. Here, the peripheral is in a battery monitoring mode, which allows the peripheral to capture information as to the battery's output voltage.

Further, once the peripheral has captured battery Vout information, the variable output of the power supply is then configured to a voltage value compatible with that of the battery. When received at the switch, the power signal from the peripheral along the third branch causes the switch to reconfigure the circuit to direct this power signal (instead of the battery's) to the host device along the second branch.

In this configuration of the peripheral delivering power to the host device, the need for a battery in the circuit is not essential, and the battery can actually be removed from the circuit. But leaving the battery attached adds an additional layer of safety to the operation of the connector assembly because, should the power delivery from the peripheral along the third branch be disrupted, the N-signal switch immediately establishes the previous configuration, with the battery as the source of power to the host device along the first and second branches—thus providing a battery backup capability.

For low-voltage (and/or data) signal switching, for example, a Maxim (Sunnyvale, Calif.) MAX 4518 is a type of multiplexer (N-signal switch) for use in a connector assembly circuit to eliminate conductors. Modifying the MAX 4518 so that it is driven by the simple application of a power signal only requires jumpers from pin 2 (EN) to pin 14 (V+), and a second jumper across pin 4 (NOI) and pin 15 (GND). Thus configured, a single power supply voltage (here from the battery and/or from an external peripheral as a power source) will trigger all four of this analog muxes' channels. The 4518 will operate with up to a 15 VDC maximum input. This voltage is within the range of some battery pack output voltages. For higher voltages, power FETs are used. The MAX 4518 can be over-voltage protected with external blocking diodes (consult the MAXIM data sheet #19-1070). An upstream voltage regulator, preferably one with a wide range of input voltages, can be used with the MAX 4518.

Embedded in a Battery Pack or Peripheral

FIGS. 7A and B illustrate a plug 307 that is configured with a four-conductor cable. Conductors 327 and 329 can be, for example, attached to an external power supply peripheral 311 configured to deliver a controllable output voltage to a host device 321. Rechargeable battery 299 is the original power source for the host device 321.

In order to determine the correct output voltage of the power supply, a second pair of conductors 327 and 331 (FIG. 7A) is used. This second pair of conductors is configured in plug 307 and its mating receptacle, so that the output voltage of battery 299 is read along first conductors 263A and 259A, and second conductor 261A. These conductors serve as voltage "sense" lines that transfer a power signal to an attached peripheral 310 that "awakens" it to read the voltage of battery 299. Once the battery voltage is acquired, which can be performed with a simple A/D converter and processor circuit in a battery monitor 310, the power supply 311's output is configured (by software that determines a voltage and controls the variable power output) to match battery 299's voltage. This voltage signal is then delivered to a host device 321 via conductors 327 and 329. This example of four-conductor connector apparatus allows an external controllable power supply to deliver a correct battery-based voltage to a host device, while simultaneously removing battery 299 from a host device's original battery-power circuit.

The sensing circuit in FIG. 7A, in this modality of the invention, is embedded—typically, in an external peripheral 308 since modifying an existing host device is usually not practical. A host device's battery, if removable, is an acceptable alternative location for an embedded A/D converter/processor and resident software. This is especially a valid approach with "smart" batteries, which often have onboard processors and A/D converters. Should a "smart" battery be the site for the embedded sensing circuit, then the signal transferred along conductors 331 and 333 can optionally be data, instead of the previously discussed power signal. Where practical, embedding the sensing function in a host device does have the benefit of potential access to an existing A/D converter, processor, and perhaps even already-resident resources for embedding sensing software. Details of the actual sensing circuit are not discussed here because such circuits are commonly known and readily available to those skilled in the art.

By including an N-signal switch (not shown, but replacing the means of controlling the direction of signal flow 301, 303, 305, and 305A in FIGS. 7A and B) into a circuit that includes conductors 331 and 333, the previously-referenced battery-voltage sensing circuit can be combined with suitable software to configure an external battery charger peripheral to deliver an appropriate charging signal to a battery 299. This adds further flexibility to this interactive circuit.

The charger peripheral 309 either replaces the external power supply 311 in FIG. 7B at conductors 331 and 333, or the sense-line conductors 331 and 329 can branch at an N-signal switch, so that a battery signal travels from the first switch position along a first branch 329 for the battery accessing the voltage-sense circuit to battery monitor 310. The battery charger 309 then uses the same conductors 329 and 327 for charging battery 299. Once the switch is in its second position, conductors 333 and 331 (directional flow control element 305A is not present) are available to the power supply 311 for powering host device 321. This configuration with a voltage-sensing circuit shared by both an external power supply and a discrete charger, allows for simultaneous powering of a host device and recharging a battery.

EXAMPLES OF CONNECTOR ASSEMBLY CONFIGURATIONS

Because a multiplicity of elements may be integrated into an individual embodiment of a connector assembly, such as insulators, insulator layers, jumpered plugs, membrane contacts, self-closing spring contacts, rotateable plugs, segmented contacts, etc., two non-limiting examples of typical connector assemblies are presented here, to assist designers and manufacturers in understanding the inter-relationship of the various elements. The following discussion is for purposes of illustrating specific implementations of the connector assembly of the invention, and it does not limit the possible construction, internal workings, elements, or uses for such a connector assembly.

First Example

A detailed description of a rotateable "key" plug and an electrically self-closing receptacle provides a non-limiting example of an effective upgrade to a host device and its associated battery pack to operate with a multiplicity of external peripheral devices. The first exemplified connector assembly depicted here adds functionality that was neither originally designed into a host device, nor its battery. The external peripheral devices in this example may, or may not, have been originally designed by the host-device vendor specifically for a particular host device. These peripherals include an external power supply, battery charger, and a battery monitoring device. These may be separate peripherals that a user interchanges, or all three functions may be integrated into a single unit, with each capable of functioning autonomously.

FIGS. 2 and 3 illustrate two views of a "key" plug 217A. A mating receptacle 257 is shown in FIGS. 5 and 6. FIGS. 7A and B diagrammatically show some of the possible circuits of the connector assembly.

Plug 217A in FIGS. 2 and 3 is configured with contact pads 227, 229, 231 and 233 on one face of insulated shaft 243. A second set of contact pads 241, 239, 237 and 235 is mounted on the obverse face of the shaft at locations that directly oppose the first contact set. A set of four conductive wires 219A–D delivers power signals to the some of the various contacts pads. In various other embodiments of a plug 217A (FIGS. 2 and 3) of the here-exemplified connector assembly, the four-wire cable and related conductors and contact pads are capable of transferring data signals, or have use for conducting mixed-signals (data and power).

For this example, cable wire 219A is electrically attached to contact pad 229 along conductor 333. Wire 219B is connected electrically to its pad 231 along internal conductor 331. Wire 219C is electrically attached to pad 235 along internal conductor 327, and cable wire 219D is connected electrically to contact pad 237, along internal conductor 329. Also, pad 227 is connected—via shunt 331A—to conductor 331 and further to cable wire 219B, being thus electrically the same as contact pad 231. Contact 233 is, in this iteration, shown as electrically inactive.

Adjacent to the above-cited reference numbers for the contacts in FIG. 2 are parenthetical callouts that identify the polarity at each contact. Some of these polarity citations also appear in FIG. 6, and also are cited in diagrammatic FIGS. 7A and B. These callouts are presented to assist tracing the various electrical paths, so as to better understand the functions of the elements of the connector assembly of the invention in this particular example.

In FIG. 2, plug contact pad 229 is identified as "229 (+)," and contact pad 231 is labeled "231 (−)." Note that, while contacts pads 231(−) and 237(−) are aligned along shaft 243 as an opposing pair, the two paired contact pads 229(+) and 235(+) are not opposite each other along the length of shaft 243. Contact pads 227(−) and 241(−) are spatially opposing, but pad 227(−) is jumpered to pad 231 (−) via a shunt 331A to internal conductor 331(−). These contact pad location relationships will be apparent in the discussion of the circuits diagrammed in FIGS. 7A and 7B.

FIG. 6 shows a plug 217A (as described above in reference to FIG. 2) partially inserted into its mating receptacle 257. When plug 217A is fully inserted, its contact pad 235(+) aligns with (but is not yet electrically coupled to) receptacle 257's spring contacts 297A and B. Plug contact pad 237(−) aligns with receptacle contacts 295A and B, while contact pad 239(+) aligns with receptacle contacts 283A and B. Lastly, contact pad 241(−) is aligned with opposing receptacle contacts 275A and B. The four opposing plug contacts 233(+), 231(−), 229(+), and 227(−) (not visible in this view) are also aligned with the same receptacle spring contacts.

A First Rotated Position

FIGS. 18A and B diagrammatically represent circuits in a typical implementation of a two-position rotating "key" connector assembly 342 interposed between a battery and its associated host device (such a connector assembly is also illustrated in FIG. 6). Plug 307 is shown in FIG. 7A in its first user-selected position, with FIG. 7B depicting the plug rotated 180-degrees. The eight contact of plug 307 are further detailed in FIG. 2 as conductive pads 227, 229, 231, 233, 235, 237, 239, and 241. So, too, are the receptacle's mating spring-loaded opposing contacts 275B, 283B, 295B, 297B, 297A, 295A, 283A, and 275A shown with more detail in FIG. 5.

Once inserted, plug 217A (FIG. 6) is rotated clockwise 90-degrees (as viewed from the cord end), to its first position (not shown). Then plug contact pad 235 electrically couples to receptacle spring contact 297A, then a power signal flows along internal flat conductor 265A, at the terminus of which are further conductors for coupling to a battery terminal (+) (not shown). Opposing plug pad 233 on insulated shaft 243 (reference FIG. 2) has rotated to now be electrically coupled to receptacle spring contact 297B. As previously noted, in this example plug pad 233 is not electrically active, and the same holds true for pads 239, and 241.

To continue in this first position of rotation, plug contact pad 237 (FIG. 2) is now electrically coupled to receptacle spring contact 295A, for transferring a power signal along receptacle's internal conductor 263A to further conductors of a circuit which terminates at a battery terminal (−) (not shown). Opposing plug contact pad 231 on insulated shaft 243 is now, having been rotated to be electrically attached to receptacle spring contact 295B, for transferring a signal along receptacle's internal conductor 263B, then to further conductors of a circuit which terminates at a host device (−) (not shown).

Further, while the rotation of the key plug repositions plug pad 239 to mechanically attach to receptacle spring contact 283A, because pad 239 is not electrically active in plug 217A (FIG. 2), no power signal flows along receptacle's internal conductor 261A. Opposing plug pad 229 is now electrically attached to receptacle spring contact 283B, which is conductive along internal conductor 261B to further conductors of a circuit terminating at a host device (+) (not shown).

Plug pad 241 becomes electrically conductive with receptacle spring contact 275A, but no power flows because pad 241 is not electrically connected within the plug shaft 243 (FIG. 2). Plug pad 227 is now electrically coupled with receptacle spring contact 275B, so that a power signal flows along internal conductor 259B, to a host device (−) (not shown). It has been noted that plug pad 227 is jumpered within plug shaft 243 to pad 231.

FIG. 18A shows, in a generic diagrammatic view, the circuits established when the above-described connector assembly is in its first rotated position. Three generic interconnected electrical devices are shown in FIG. 7A: 1) a host device 321; 2) the host device's associated battery 299; and 3) an integrated multi-function peripheral 308. Peripheral 308 includes a user-selectable power supply module 311 to service host device 321, a battery-monitoring module 310 to service battery 299, as well as a battery-charging module 309 for servicing battery 299 (battery charging is not user-selected in the circuit shown in FIG. 7A. As will be seen, the various capabilities of a multi-function peripheral 308 are enabled by selective positioning of a rotateable plug (diagrammatically identified as plug 307 in FIG. 7A).

Tracing the Electrical Paths

The circuits created by a selectively-positionable plug (217A in FIG. 6, and 307 in FIG. 7A) in its first rotated position cause power signals to flow along certain electrical paths. Starting at power supply peripheral 311 in FIG. 7A, the signal transfers along conductor 327 in plug 307 to plug contact pad 323 (labeled as 235 in FIG. 6). Because rotating the "key" plug 307 electrically couples plug pad 323 to receptacle spring contact 325 (297B in FIG. 6), power then flows along conductor 265B to conductor 261B, then to a host device 321. Note that plug 307's pads 239 and 241 are electrically inactive in the plugs first rotated position.

To continue in FIG. 7A, from host device 321, the power-delivery path continues along conductor 263B, to receptacle contact 295B where plug pad 237 is electrically coupled for transferring the signal to plug conductor 329 and then to external power supply 331. This circuit between power supply 311 and host device 321 is an electrical path independent of the host device's battery 299 which is, by the insertion of a plug 307, electrically isolated and not available to host device 321 as a source of power.

On the battery side of the connector-assembly circuit in FIG. 7A, an electrical path is created when a user-positionable plug 307 (217A in FIG. 6) is in its first rotational position. A battery-monitoring module 310 incorporated into this modality of attachable external peripheral 308 is electrically active with battery 299. A first electrical signal from battery 299 transfers along receptacle conductor 261A to receptacle spring contact 283A. This contact is electrically coupled to plug contact pad 229 by the positioning of plug 307, causing the battery signal to then travel along plug conductor 333, then to battery monitor 310. A second electrical signal from battery 299 transfers along receptacle conductor 263A to spring contact 295A, which is electrically coupled to plug pad 231, allowing the signal to then transfer along plug conductor 331 to battery monitor 310.

Note that the battery's electrical signal also flows along a branch 259A (FIG. 7A) of conductor 263A, where receptacle contact 275A is coupled to plug pad 227. A jumper 331A allows the battery signal to also flow to plug conductor 331. Means of controlling the direction of electrical flow 305 and 305A prevent signal to flow from an external peripheral to a battery along these branched conductors, but only allow signal flow from a battery to an external peripheral. Thus, were the external battery charger 309 somehow be mistakenly activated while plug 307 is in its first position as depicted in FIG. 7A, the charging signal cannot transfer to battery 299. Only when plug 307 is in its second position, as will be discussed in reference to FIG. 7B, can battery 299 be charged.

With a connector assembly 220 (FIG. 6) configured in its first position with plug 217A rotated to configure the circuits diagrammed in FIG. 7A, a host device 321 is powered from an external power supply 311, while a battery 299—now no longer powering the host device—is simultaneously and independently accessed by a battery monitor 310. Operationally, the connector assembly is enabling the monitoring module of attached peripheral 308 to acquire the electrical characteristics of battery 299, the acquired characteristics being then used to determine a host-device-compatible output for configurable power supply 311, thereby ensuring that the power signal delivered to host device 321 is fully compatible. Thus, by providing these functions through a single connector assembly, external devices are optimized by performing two independent functions simultaneously.

A Second Rotated Position

FIG. 18B shows, in a generic diagrammatic view, the electrical circuits created when a plug 217A (FIG. 2) is user-rotated to its second selectable position in a receptacle 257 (FIG. 6). Of the three generic peripheral devices 308 previously discussed, in this configuration a host device 321 is still being powered by an external power supply 311, but battery 299 is no longer being monitored but, instead, is being charged by a battery-charging module of peripheral 308.

In FIG. 7B, the electrical path for transferring electrical signals between external power supply module 311 and host device 321 is, by a user having rotated plug 307 to its second position, been directed along a different circuit than that describing the first plug position. Now, conductor 333 of plug 307 transfers an electrical signal to plug pad 229, which is in electrical contact with receptacle spring contact 283B, thereby allowing the signal to flow to receptacle conductor 261B to its terminus at host device 321. Note that conductor 261B branches into conductor 265B, but that the electrical signal flowing then to receptacle spring contact 297B does not flow beyond plug pad 233, which is not electrically active (reference the plug conductor configuration of FIG. 2).

The flow of electrical signal of power supply 311 continues from host device 321 (FIG. 7B), the circuit continues along receptacle conductor 263B to spring contact 295B, which is electrically coupled to plug pad 231, allowing the signal to then travel along plug conductor 331 to power supply 311—thus completing a circuit between a power supply 311 and a host device 321.

An alternative electrical path from host device back to power supply 311 (FIG. 7B) is along receptacle conductor 263B, then to branched conductor 259B, which leads to receptacle contact 275B. Contact 275B is electrically coupled to plug contact pad 227, so the signal continues to plug conductor 331 by flowing across a jumper 331A. A means of controlling the direction of signal flow 305A in plug conductor 331 is avoided by using this alternative electrical path, so that any voltage drop (from components such as a diode) is not a consideration.

As with plug 307 in its first position (FIG. 18A), so too in its second position (FIG. 7B) does the resulting circuit electrically isolate a battery 299 from its host device 321. However, since the receptacle contacts are in opposing pairs and spring-loaded as shown in FIG. 17, retracting plug 307 reestablishes the original circuit between the battery and its associated host device.

Further, the circuit between power supply 311 and host device 321 are independent of the circuit between battery 299 and external charger 309. In the example being discussed here, the rotation of a plug 307 has two positions, so the second position results in both battery charging and delivering power to a host device simultaneously. Additional rotational positions are used if discrete operations for battery charging, host-device power delivery, and any other peripheral functions as may be desired.

Battery Charging Circuit

The circuits created by selectively positioning a rotateable plug (217A FIG. 6, and 307 in FIG. 7B) in its second configuration provides an electrical path for charging a battery 299. From external battery charger 309, plug conductor 329 transfers a charging signal to plug pad 237, which is electrically coupled to receptacle contact 295A, then the charging signal continues along receptacle conductor 263A to battery 299.

Further, from charger 309 the signal also transfers along conductor 327 to plug pad 235. The pad being electrically mated to receptacle contact 297A transfers the signal then to receptacle conductor 265A and thence to branched conductor 261A directly to battery 299.

Thus, with plug 217A in its second position of rotation (FIG. 7B), a battery 299 is charged from an external battery charger 309, while a host device 321 is independently—and simultaneously—powered from an external power supply 311. Once plug 307 is removed, pairs of self-losing opposed receptacle contacts 283A and 283B deliver a positive power signal from battery 299 to host device 321. Note that the means of controlling the direction of electrical flow 301 in the positive polarity conductor 265A prevent battery signal flow to host device's conductors 265B and 261B. Each pair of self-closing receptacle contacts 275A and 275B, as well as opposing spring contacts 295A and 295B together deliver a negative-polarity power signal from battery 299 to host device 321.

Defining External Devices

Multi-function external peripheral 308 (FIGS. 7A and B) is user-attachable to connector assembly circuits 340 or 342. The three indicated peripheral devices are a battery monitor, a power supply, and/or a battery charger. The operational characteristics of each of these units is briefly discussed here to assist connector designers and manufacturers in better understanding the versatility and adaptability of the rotateable "key" connector assembly.

Battery Monitor

External battery monitor 310 (FIGS. 7A and B) is characterized as an either freestanding module (or integrated circuit in a multi-function peripheral) that performs a data acquisition function, primarily acquiring voltage values from a battery 299. An A/D converter and a simple processor are the key elements in this module. The processor has a data I/O which is used to communicate battery voltage to a configurable power supply 311.

Battery monitor 310 (FIG. 7A) performs both load and no-load samplings of battery 299's output voltage to ascertain whether battery 299 is in a relative state of full-charge, or almost completely discharged. Should battery 299 be fully charged, its no-load output voltage can be substantially higher than its manufactured design output voltage. For example, a battery pack manufactured as "12 VDC" may read nearly 14-volts output under no-load sampling, even though it has less than 40% remaining capacity, but that output voltage may drop to less than 10.5 volts when tested under load. A fully charged battery would not likely read less than 12-volts output when sampled under the same load. Since battery output may cover a range of voltages, depending on the load vs. no-load sampling results, software in battery monitor 310 uses a look-up table and an algorithm to determine what the manufacturer's design voltage is for battery 299.

Software attempts to accurately define an optimized operating input voltage for host device 321 in FIGS. 7A and B. Depending on its battery input-voltage design parameters, host device 321 can have a Vmin operating voltage well below the 12-volt rating of its battery 299. If the designer of host device 321 was striving for maximum battery-operating time, the Vmin battery voltage may be set low, to use every last coulomb of battery 299's capacity. With a Ni-Cad battery, this Vmin voltage cut off can be set as low as approximately 8 VDC. The spread between a battery 299's no-load and load voltage test results is a reasonable indicator of the remaining energy reserves (i.e., capacity) in the battery. If both Vmin and Vmax are depressed, then it's highly probable that the battery is near exhaustion. Another indicator is how long it takes for a battery to recover from a load test.

All commonly used battery chemistries exhibit an accelerated voltage drop-off curve near the lower limits of their capacity, although the slope or rate of voltage drop may vary. So, reading under-load samples over time, or for a sustained amount of continuous time, are also somewhat valid probative procedures for evaluating the remaining capacity in the battery pack.

Of course, if battery 299 (FIGS. 7A and B) is a smart battery and if there are data lines available, battery monitor 310 can simply poll the battery's data registers for information about the battery's fuel gauge reading. The connector assembly can be easily modified with additional plug contact pads and receptacle spring-contacts to provide both power and data interfaces. However, even smart battery technology, with its sophisticated fuel gauges, is not very accurate when it comes to determining the amount of energy remaining in a battery. Error rates are sometimes 10–20%. Knowing this, host device manufacturers tend to allow an adequate margin of capacity in a battery at the prescribed Vmin battery shutdown voltage.

For more information about battery monitoring hardware and software, as well as configurable power supplies, see my U.S. Pat. No. 6,459,175 "Universal Power Supply" (1 Oct. 2002).

Know Where the Key Is

The relevance of the above discussion regarding knowing the approximate capacity reserves of battery 299 in circuit 340 (FIG. 7A) is related to connector assembly 340. If a battery is near its state of total depletion, then battery monitor 310 is limited in the tests it can perform for data acquisition. In such a situation, continued voltage sampling under load will produce variable results.

Also, it is important that the software for operating all external attached peripherals, e.g., power supply 311, be continuously informed as to which of the two positions "key" connector plug 307 is set. Since a user can elect to bypass the first position of rotating "key" connector plug 307, one of the functions battery monitor 310 performs is providing information to assist the processor in identifying the plugs selected position. One method of verifying that plug 307 is in its first position (circuit configuration 340 in FIG. 7A, as opposed to circuit 342 in FIG. 7B), is for battery monitor 310 to continuously poll the circuit at conductors 331 and 333 for the presence of a battery signal.

Although highly unlikely, a battery that is so discharged that it may no longer deliver even a no-load output voltage for a reasonable period of time may jeopardize the reliability of detecting plug 307's position. Should the battery monitor be unable to acquire a reasonable battery voltage that conforms to the software algorithms, the configurable power supply could be unable to deliver an appropriate power signal to the host device. Again, this situation is admittedly highly improbable, since properly written software will prevent the power supply from performing inappropriately. But, even if the power supply is misconfigured, the chances of an under-voltage doing harm is virtually zero, because any voltage below the host device's pre-set "drop out" voltage will simply fail to turn on the host device. As to over-voltages, batteries battery-operated host devices are designed to operate when their batteries exhibit—as all batteries do, especially freshly-charged ones—extreme over-voltage spikes.

In another unlikely hypothetical situation, if the key-connector plug is user-rotated to the second position (shown in FIG. 7B) without being first rotated to the first position of FIG. 7A, the circuit would allow the power supply to transfer its signal to the battery, instead of the host device. The reality of this occurrence is only based on software that would configure the output of the processor-controlled power supply in a situation where there was no previous acquired battery-voltage data. Obviously, software used in conjunction with this connector assembly would not turn on the power supply without first polling the battery for voltage information. Even more to the point for those software developers and programmers working with this connector assembly is to continuously poll battery voltage with the battery monitor, and shut down the power supply output as soon as any acquired battery voltage reading is zero, or when an acquired voltage value falls outside those in the algorithms, or look-up tables.

Thus, knowing how reliably, and for what amount of time, a polled battery will deliver a readable output voltage is important to the operation of connector circuit 340 and 342.

Battery monitoring units always shut down the power supply output if an abnormal voltage reading occurs. In the situation that a battery is incapable of sustaining a minimum voltage under load, the battery monitor software should default to a shut-down command to the power supply.

Designers and manufacturers of peripheral devices and connectors should also consider the use of an output-current sensor circuit, which is polled at the battery monitor's A/D. Any change in the load at power supply 311's output (i.e., the electrical load attributable to a host device that is turned on) indicates that the host device has been turned off, or that the connector plug 307 has been either disconnected, or rotated to its second position. The sensitivity of this current sensor is such that even a momentary absence of resistive load is considered sufficient to shut down power supply 311's output. This is especially important if the user is rotating the plug from its first to its second position.

The processor that controls the configurable power supply operates on information provided by the battery monitor. Specifically, based on acquired battery voltage information, the proper calculated input voltage of the host device is sent to power supply as a Vref value. Being a controllable switching power supply, it can output whatever voltage battery monitor 310 commands. Power supply 311 is also capable of matching Vref as a function of its voltage-sense feedback loop. Specific information about the operation and characteristics of such a power supply is available in my U.S. Pat. No. 6,159,175, "Universal Power Supply" (1 Oct. 2002).

The positionable connector provides electrical paths to the host device along which the external power supply peripheral can output a power signal that corresponds to the battery voltage value previously acquired by the external monitoring device. This connecting of an external monitoring device affords an efficient and simple way for an external adjustable-voltage power supply to be configured for delivering the correct input-voltage to a battery-powered host device. By sampling the host device's battery voltage, then delivering that voltage back to the host device, automatic and error-proof power configuring is achieved. The battery circuit is isolated by the connector assembly so that no power signal is delivered to the battery, but only to its host device.

Battery Charger

A battery charging module 309 (FIG. 7B) can also be available either as a stand-alone unit, or integrated into an external peripheral 308. The role of battery monitor 310 in conjunction with a battery charger is similar to that already described in use with a power supply 311. Battery monitor 310 gathers data about battery 299, as well as information as to the position of rotate-able plug 307 (both operations are inter-related, as indicated previously). Once the presence of a battery 299—and the appropriate user-selected plug position for charger connectivity—are verified, battery monitor 310 determines the appropriate charge type and peripheral configuration. Charge type is based on battery chemistry. See my U.S. Pat. No. 6,459,175, "Universal Power Supply," (1 Oct. 2002) for information on charging based on battery chemistry. Other tests are done to verify not only the type of battery, but the condition of the battery pack to accept a charge. This procedure may include a sophisticated impedance test, and perhaps even some cell balancing for Li-Ion batteries. These tests are essential because Ni-Cad charge characteristics, voltages and charge rates vary considerably from the method used to charge Li-Ion cells. Information about impedance testing is available from Cadex Electronics Inc. (Burnaby, BC, Canada).

In a modality having both a battery charger 309 (FIGS. 7A and B) and a power supply 311 integrated in a multi-purpose external device assembly 308, battery 299 can be charged simultaneously with power delivery to host device 321. This embodiment reflects the same functions normally available to a battery 299 and its host device 321 when a plug 307 is removed. In other words, the primary circuit between host device 321 and battery 299, as they were configured when manufactured, is reestablished.

An Application of a Rotating Connector

With data acquisition capabilities provided by a battery monitoring peripheral 310 (FIG. 7A), a battery 299's power parameters can be acquired. A connector assembly 340 with its plug is rotated to a first position, makes it possible to confirm that a battery pack 299 is present and available. Furthermore, that battery is known to not be receiving a charge, because the battery terminals are connected to the monitoring unit, and not to a charger 309. As long as battery monitor device 310 is occupying battery 299, there can be no battery charging activity. By constantly polling the battery, a battery monitor can keep track of the battery's non-charging status. Connector plug 217A has been positioned to create an electromechanical redirection of battery 299's circuit. There is no path for host device 321 to access its battery 299 while plug 307 is in its first position.

Regarding the first and second selectable positions of a plug 307, note that there is a "pre-rotation" position that the plug is in when inserted FIG. 6 depicts a plug 217A partially inserted, with the plug's contact pads at 90-degrees to the receptacle's four pairs of self-closing contacts. Once the plug is fully inserted, and before a user rotates it to its first position, the plug's insulated shaft 243 has separated each of the receptacle contacts from its opposing contact, and the nonconductive plug shaft is now mechanically attached to the receptacle's contacts. In this "pre-rotation" mode, all circuits are open. The battery is disconnected from its host device, and none of the external peripherals are accessible to either the battery or host device. From this connector-assembly state, a user then rotates the plug 90-degrees to its first position.

See discussions elsewhere about using diodes, or equivalent means of controlling the flow of electrical signals, in circuits like those in FIGS. 7A and B, to allow a battery to deliver power to its associated host device, while the connector assembly is in use. A diode approach can be incorporated into the two circuits shown here, and anyone skilled in the art can implement such additional signal flow control to the circuitry.

Having confirmed that battery pack 299 in FIG. 7A is in a non-chargeable mode, external power supply 311 safely applies power to host device. Battery monitor 310 communicates its acquired battery power parameters to a processor (not shown) that controls the power-output configuration of the power supply. The processor can reside either in the power supply module, or the battery monitoring unit. The power supply configuration is thus based on the battery 299 that is associated with—and matched to—the host device. This assures a correct input voltage for the host device.

Note that host device 321 in FIGS. 7A and B receives its power through circuits which—when plug 217A is retracted—directly connect the host to its battery. Receptacle 257 in FIGS. 5 and 6 has self-closing contacts. When no plug is present, electrical signals pass through the receptacle, as if it wasn't in the circuit between battery 299 and its host device 321.

The first conductive path between battery 299 and host device 321 has a signal traveling along receptacle conductor 261A (FIG. 7B) to self-losing contact pair 283A and 283B (which, now that plug 307 has been withdrawn, are electrically coupled). The signal then flows to conductor 261B and thence to host device 321. The second conductive path between battery 299 and host device 321 has a signal transferring along receptacle conductor 263A to self-closing contact pair 295A, which is now electrically coupled to opposing spring-loaded contact 295B. The signal then continues along receptacle conductor 263B and thence to host device 321. Thus, host device 321 is powered independent of its battery 299 when a plug 307 is inserted, then host device 321 is powered by its battery 299 when plug 307 is removed.

Safety Considerations

Should the operator of a host device 321 rotate key 307 a full 180-degrees from its present second position (FIG. 7B), so as to return it to the first position, there will be an immediate change of state in the battery monitoring circuit (FIG. 7A). The diagrammatic circuits in FIG. 7B have the battery monitoring unit 310 only accessible to host device 321, instead of to battery 299. In this configuration, the monitoring circuit is being utilizes for acquiring power-signal information relevant to the output of power supply 311. As soon as plug 307 is rotated away from its second position, so that the plug's and receptacle's various mating contacts become electrically uncoupled, monitoring unit 310 detects an open circuit state at conductors 327 and 329. In this state, battery monitoring peripheral 310 acquires a 0-Volts value, which is used by the processor and its related software to issue a shut-down command to power supply 311. This circuit between a battery and a battery monitoring peripheral provides inherent safety, since the power supply will always shut down when a plug 307 is in any other positions than those in FIGS. 7A or B. This includes a shut down during the momentary interval that the plug is transitioning from one active position to another.

Software developers and programmers should select a fast sampling rate for the monitoring unit's A/D, since a user can rotate the plug past its first selectable position to its second position, in order to initiate a battery charging operation. During the micro-second or so of such a plug rotation that the system is in the state shown in FIG. 18A, a fast sampling rate will enable the acquisition of several battery-power readings . . . more than sufficient to enable the processor to configure both the power supply and battery charger. Also, connector designers may achieve some benefit by enlarging the footprint of the plug's contact pads, to extend the time period that the connector assembly is in the state depicted in FIG. 7A.

In certain locations, such as on commercial aircraft, and in industrial environments where flammables/volatiles are present, battery charging may pose a safety risk. With the circuits of FIG. 7A, battery charging cannot occur, because diodes (or equivalents) control the direction of power flow as indicated by arrows 303, 305 and 305A. In FIG. 7B, plug contact pads 235 and 237, along with diode (or equivalent) 301, ensure that charging can be performed. Diode 301 (FIG. 7A) is in plug conductor 331, so it is removed from the battery-to-external-device circuit when plug 307 is rotated from the first user-selected position shown in FIG. 7A, to the second selected position depicted in FIG. 7B.

Comparing the two circuits depicted in FIG. 7A to FIG. 7B, external battery charger 309 does deliver power to a circuit shared by a battery 299 and its host device 321. Should battery charger 309 be active when plug 307 is in its first position shown in FIG. 7A, diodes 303, 305 and 305A prevent power from flowing to receptacle conductors 263A and 261A. Thus, the safety of not charging a battery is inherently available with the rotating "key" connector assembly. By simply altering the means for controlling the flow of electrical signal 301 to point in the opposite direction, the entire battery charging capability of the connector is easily and totally eliminated.

As FIGS. 7A and B illustrate, in order to create a new circuit, a connector assembly of the invention in which a plug 217A and a mating receptacle (FIG. 6), requires at least one switchable electrical line, plug contact pad, or self-closing receptacle contact to change its electrical connection. There may be other than power signals addressed by a rotating "key"-style connector assembly, for example, the Clock, or Data signals available to a "smart" battery. As has been seen, there need not be any data signals present. If data signals are present, one or more of them may be used, without limitation, for the proper functioning and operation of the connector assembly.

Interrupted Data Lines and "Virtual" Data Lines

To disable battery charging, for example, any of the connectors shown (but not limited to those shown or equivalents) can effectively interrupt and reroute a data line. In a smart battery circuit, for example, rerouting a Clock, or Data line will disrupt the link between a host device's charging circuit, battery selector, or keyboard controller—the disruption of any one of which is sufficient to prevent battery charging. A battery cannot effectively communicate its request to be charged if Clock or Data lines are not available. The data lines communicate in conjunction with the negative power ground in the SMBus Smart Battery Bus topology, so even intervening a connector assembly that interrupts a powerline will prevent battery data communications. A smart battery data line can be physically interrupted and rerouted using a "key" connector like any shown here, for example.

Most smart battery data communications require three or four conductors. Smart battery/host connectors typically have five contacts. To disrupt all five lines with a connector such as that shown in diagrams 340 and 342 (FIGS. 7A and B) would require 10 conductors, with five conductors from a battery pack to an external device, and an additional five lines from another external device to a host device. While adding two more contact pads to a plug 307 in FIG. 7A isn't impractical, it does create a substantially longer male "key," as well as a more complex receptacle. Further, the cumbersome cables that might result from routing 10 mixed-signal lines to external devices are not desirable.

But data transfer is not always limited to the use of cables and connectors. Wireless data is currently available in the form of radio frequency (RF) or infrared (Ir). This is relevant, in this example, to the elimination of conductors between an external third device, such as a battery monitor (or a battery monitor coupled to an external power supply). In some battery and host data communications implementations, data continuity to a host device may have to be maintained, so that the host system detects a battery (or equivalent, such as an external power supply peripheral) present. If no handshake between some batteries and their host devices occurs, the host device may refuse to turn ON, or it may lose track of its battery's "fuel gauge" readings. A wireless link can be established so that, even though the physical data circuit between a battery and its associated host device has been disrupted temporarily by a connector assembly, a substitute data telemetry link can be used.

Alternative Electrical Paths

Alternative data paths for battery/host communications can be created by using an existing data I/O port of a host device. One implementation of such an alternative bi-directional data path integrates a multi-contact key connector in a small insertable I/O device (a PC Card, for example), into which battery/host data lines are routed at an existing data I/O port. The PC Card's data communications interface to external devices, such as peripheral 308 in FIGS. 7A and B, is wireless.

Another approach is a connector assembly that is in its usual location between a battery and host device but, instead of data conductors branching from the connector assembly to a hardwired external peripheral, the data conductors terminate at a tethered wireless I/O module, dongle-style. The powerlines also pass through the tethered module, so that, for example, an attached power supply peripheral 311 (see FIGS. 7A and B) has only two power conductors between it and the tethered wireless I/O module. Data cables are eliminated by the use of a wireless communications link between the external peripheral and the dongle-style module.

The purpose of these intermediate PC Card or wireless dongle-style module is to acquire data from a smart battery over existing conductors and interfaces that are already in place in a host device, instead of having to reroute multiple data conductors to an external device such as a power supply peripheral. The number of data lines to be rerouted can be considerable, since a connector assembly such as the key connector as depicted in FIGS. 1–7B has eight plug contacts and four cable conductors, and the version of the connector depicted is only for power-signal transfers between a battery and host device. If the battery/host interface has only two additional data communication lines, then four additional contacts and four more cable conductors are potentially required. Eliminating cable conductors is, thus, a worthwhile design and manufacturing consideration, and a wireless interface adds user value by making external peripherals more transportable and by minimizing the desk clutter of cables.

The PC Card or wireless dongle performs data acquisition functions. This is especially easy if the PC Card used is a National Instrument (Austin, Tex.) DAQ card, or equivalent. Another alternative is to use a dongle configured like a Micro Computer Control (Hopewell, N.J.) SMBus monitor, that converts SMBus smart battery data to $I^2C$, or RS-232. A number of Infrared wireless dongles use a standard RS-232 interface for serial port communications, so the Micro Computer dongle is an especially good candidate for such a wireless link modification. Since both RF and Ir PC Cards and dongles already exist, the modification by one skilled in wireless communications is entirely feasible.

The dongle-style intermediate module operation has computer-readable data that originates at either a battery or a host device available at an intervening connector assembly of the invention, the connector being positioned between the battery and host so as to have access to data from either/both the battery and/or its host device. Data signals then transfers from the appropriate data contacts of the connector along conductors that terminate at the intermediate dongle module. Circuitry within the module translates the data to a wireless protocol and transmits the wireless data signal, to be received by an external peripheral, e.g., a battery monitor and power supply. Circuitry in the peripheral processes the received data, as exemplified by a battery monitor acquiring battery power data for purposes of configuring a power supply to deliver power to a host device. In this example, the configured power supply then outputs its power signal along powerline conductors that pass through the intermediate dongle and then to the connector assembly, where contacts and conductors directed to the host device transfer the power signal to its destination.

Should the host device in this example require a data handshake from its battery before accepting a power delivery, that handshake data signal transfers wirelessly from the external peripheral to the intermediate dongle module, then travels along host-specific conductors to the connector assembly where the signal then transfers to the host-device's data contacts.

The PC Card modality operates somewhat differently than the intermediate dongle module version, with existing circuits within the host device transferring data signals to the PCMCIA I/O port. The connector assembly in this modality has only power contacts and conductors and does not require data contacts, since data passes normally between a battery and its host device, to be intercepted for peripheral use at the PC Card port. Using the same power-delivery example cited for the dongle modality, data originating at the battery transfers to the host device, wherein an appropriate data bus directs the battery data signal to the PCMCIA port. An inserted PC Card converts the data to a suitable wireless protocol and sends the battery data to a peripheral. The received signal at the external peripheral is acquired by a battery monitoring unit, and the peripheral's processor and software use the acquired data to configure a power signal to be output by the peripheral's power supply. The power signal is then transferred along powerline conductors directly to the connector assembly, where the appropriate connector contacts deliver the power signal to the battery contacts in the battery bay of the host device.

If, as in the previous example, a battery/host handshake is required for power delivery, the external peripheral transmits to the PC Card wirelessly an appropriate data stream that emulates the battery signal, then the PC Card circuitry transfers that handshake data to the hosts' internal data bus for access by the host's internal power circuitry.

Software at the intermediate devices (PC Card or dongle-style module) filters data streams of a host device and/or a smart battery, looking for data relevant to battery charging. The software captures data relevant to critical operations such a request for charging that originates at the smart battery, for example. Upon capturing such filtered data, it is transmitted wirelessly to an external peripheral which, in that situation of a battery-charging request, send a wireless signal back to the intermediate module. At the intermediate module, the peripheral-based message is internally directed to the conductors of a rotating connector 307 in FIGS. 7A and B that direct the data signal to the smart battery's data contacts. The transferred message can be any suitable "faux" information that causes the battery to stop sending requests for charging, such as communicating information to the battery that the host's internal charger circuitry is not available.

Malfunctions, such as spurious data on the smart battery bus that is misunderstood as a request to battery charge, are handled by having an external power supply (which is attached at the battery connectors in the host device, and not at the host device's power input jack), send "faux" data to a module previously described, which is routed to a host device through a connector such as the ones illustrated here. Viewed in one way, an external power supply's data intervention into a battery-to-host interface is one of emulating a battery when communicating to a host, and emulating a host when communicating to a battery. The task is, in this example, to prevent battery charging, so one approach is to send appropriate misinformation to a host system, that emulates a malfunctioning battery. Data sent to a battery emulates host messages which indicate that charging functions are not available.

In context of SMBus-based smart batteries, the host receives information from an external power source that the temperature level in a battery is exceeding a pre-set alarm level, for example. That will disable a charger. A battery can receive alarm or alert states, which indicate a "no-charge-available" condition in the host system.

Another hypothetical scenario that could potentially cause an inappropriate battery charger activation in a host device might be that a plug such as 307 shown in FIGS. 7A and B could be inserted during an ongoing charging activity between a host 321 and its battery 299. This is another highly remote situation, since the insertion of a plug 307 will disrupt all of the power and data lines. FIG. 6 shows a plug 217A in the process of being inserted. The insulated plug shaft 243 disrupts each receptacle spring clip as the plug is inserted. At the point when plug 217A is fully inserted, and before the plug is rotated, all lines are disrupted, so a host device would see this event as the same as if the battery had been removed (all power and data conductors open). It would take an inordinate malfunction for a host device's smart battery charging circuit to keep functioning after any one of the four power/data lines was disrupted, and for a charger to still be outputting a power signal after all four lines had been disrupted would be a significant improbability. Only when plug 217A is rotated are any circuits created, and none of those circuits depicted in FIGS. 7A or B directly connects a battery 299 to its host device 321.

The issue of a host system turning on a charging circuit while an external device is using those same battery lines to input power to a host system is moot. The probability of this happening is very remote, for two reasons. First, the host device is not drawing power from its normal power input jack, but instead it is drawing power from what it perceives is a battery. There is no acknowledged power source connected to the host device that indicates available power to charge a battery, i.e., there is no AC/DC adapter or wall adapter connected to the power input jack of the host device. This makes any possibility of a host device being able to charge a battery essentially zero. Second, there is no request for a charge activity from a battery, so a host's charging circuit has no valid reason to turn on the charging circuit.

Thus, in situations where the number of data lines is excessive enough to make wired communications to and from an external device impractical, wireless data communication links serve as an alternative to wired data conductors. The role of a connector assembly is the same . . . to create new data (and perhaps power) paths that are available to an external device.

Default Mode

As previously discussed, to restore a host device 321 in FIG. 7A or 18B and its battery 299 to its original configuration (i.e., so that a battery can directly power and/or communicate with a host device), it is only necessary to remove "key" connector 307. Opposing receptacle contacts 275A and B in receptacle 257 (FIG. 6) automatically close when plug 217A is retracted. A direct circuit between a battery and its host device is then re-established. In the embodiments discussed wherein only powerlines are rerouted through a multi-contact plug 217A, power connections are restored directly between a battery and its host device. In FIG. 6, receptacle contact clips 295A and 295B (−), and contact clips 283A and 283B (+) in receptacle 257 are reconnected as the "default" mode.

In FIGS. 7A and B, an N-signal power switch 306 is shown that reduces the number of conductors required to external device construct 308. To operate switch 306, voltage from battery 299 enters the switch along power lines 331 and 333. Power applied to switch 306 causes it to close internal switch contacts that control power lines 327 and 329. Plug 307 is rotated into the position shown in circuit 340, so that power can flow from battery 299 to switch 306 along conductors 331 and 333. When a switch 306 is present in circuits 340 or 342, the continuation of power lines 331 and 333 between switch 306 and external device construct 308 does not exist. Switch 306, therefore, is installed in the base of a key connector. Thus, only two wires run between plug 307 and any external devices, when a switch 306 is present in the circuit.

Implementing a switch 306 in the circuit provides an alternate safety mechanism that ensures that rotating plug 307 is in the position shown in FIG. 7A. Voltage from battery 299 to switch 306 indicates that plug 307 is in this position. If plug 307 were rotated to the position shown in FIG. 7B, there would be no voltage on power lines 331 and 333 from battery 299, so the switch's control of power lines 327 and 329 would not be available. This essentially disables the link between power supply 311 and host device 321. In this modality, when plug 307 is in the position indicated in FIG. 7B, external power supply 311 cannot power host device 321, nor deliver a power signal to battery 299. Therefore plug 307's function when in the position indicated in FIG. 7B is to entirely turn off any power from any external devices 308, as well as internal power between battery 299 and host device 321.

An example of an application for such a switch, which eliminates any possibility of battery charging, would be in an aviation situation, where the use of a connector assembly 340/342 in FIGS. 7A and B is appropriate. Connector assembly, as shown in configuration 342, creates electrical paths in FIG. 7B that allows the use of an external charger 309, to charge a battery 299. By including a switch 306, this second position of a plug 307 is defeated, so that no charging can occur. Airlines would distribute such an N-signal switch-enabled plug 307, preferably with an attached power cord specific to airline use. Passengers having a non-switch-enabled plug 307 (which would charge batteries) would not be able to use their connector embodiment on a plane, as only the aircraft version would attach to airplane power systems.

An electrical or mechanical switch can be integrated along the conductors of plug 307 (FIG. 7A). Such a switch closes the circuit between conductors 331 and 333, as well as between conductors 327 and 329 (based on the circuit configuration discussed in the section "Y-Connector"). If this switch is located outside the plug housing as, for example, a controllable switch (microcontroller activated) integrated into an external peripheral, the switch goes open when the peripheral is turned OFF (but the peripheral is left connected to the battery and host by a connector assembly 340), since the switch—and its controller—require power from battery 299.

To configure such a switch that resides outside plug 102A, a power signal to operate the switch originates at battery 299. The voltage signal flows from the battery to plug conductors 331 and 333 and then to the switch (and its associated controller) located in FIG. 7A in element 306.

Designers and manufacturers of the connector assembly of the present invention should review the discussion herein relating to N-signal switches, since these type of switches are configurable to operate by the presence or absence of an input voltage (no controller required). In this application, the presence or absence of a power signal from the external power supply in its ON and OFF states would serve as a means of activating a switching function. A detailed discussion of the configuration of such a switch is beyond the scope of this material, but those skilled in the art will readily be able to integrate an N-signal switch into the circuit of the connector assembly.

A Second Example

A Battery Pack-Specific Connector

A host device and its associated battery pack present a well-suited environment for a connector assembly that can, by the insertion, retraction, and/or rotation of its plug, create or reconfigure circuits.

Battery packs, with either primary or rechargeable cells, are typically removable. Or, individually replaceable battery cells are contained in a removable battery holder. So, if a connector can be fitted into the confines of an existing battery pack, and the newly-created circuits achieved by doing so can be defined in the battery pack itself, then the use of such devices is dramatically enhanced. Consumers can simply acquire such an upgraded battery pack or battery holder, and install it in place of the existing battery pack/holder. Manufacturers of host devices are able to offer an accessory product that enhances the usefulness and functionality of their host devices, without having to modify existing host devices already in consumers' hands.

Because batteries do wear out, consumers will—sooner or later—require a replacement battery pack. For example, today's Lithium-Ion battery cells claim about 500 charge/discharge cycles. In reality, the average battery user can expect only about 300. That usually equates to the battery's storage capacity starting to show signs of decreased run time in approximately 1–1.5 years. The user's awareness of decreased capacity may happen even sooner, especially with cellular phone battery packs. Reduced talk time or wait time is often noticed quickly by a cellular phone user. But, whatever the application, battery-powered device users inevitably are required to replace a worn-out battery.

The Connector

The connector assembly described here has characteristics and features which make it suitable to battery pack modalities. It can be built inexpensively, typically without exotic materials, in a compact size small enough to integrate into existing battery packs. Furthermore, the connector in FIGS. 1–7B is simple to use, requiring (in one of its embodiments) no rotating of its plug.

Connector assembly 220 in FIG. 1 is comprised of two elements, a positionable "key-style" plug 217A and receptacle 257. This connector assembly is optimized to fit the space restrictions of a typical battery pack housing. Its compact overall configuration adapts well to the limited available space in a battery enclosure, or for mounting as a primary power port "jack" in a host device. By utilizing thin conductive strips as conductors (see FIG. 6, elements 259A & B, 261A & B, and 263A & B), overall height requirements are minimized.

The insertable plug 217A, B, or C has an insulated shaft 243 with surface-mounted contact pads 227, 229, 231, 233, 235, 237, 239, and 241. Insertable plug 217A is comprised of as few as two conductors. "Key" connector 217A does not have to be first inserted, then removed, rotated 180-degrees, and again reinserted into receptacle 257. Key connectors 217A, B, or C are not removed, but are rotated while inserted.

The plug performs different power (or data) functions, depending on how it is positioned after insertion. In its first rotated position, as shown in FIG. 7A, plug 307 creates a conductive path to a battery cell (or cell cluster), while also simultaneously creating a separate electrical path to a host device. By introducing a peripheral, such as an external power supply, between a battery and the host device that battery previously powered, the battery can be bypassed so that the external power supply can deliver power directly to the host device. By having the power supply be configurable in its output, the interposed power supply can output a power signal exactly like that of the battery. Thus, the power supply becomes configured to be a true battery "surrogate," perfectly mimicking the host device's original battery power source (see previous section "Theory of Operation").

In the plug's second rotated position (FIG. 7B), the previous access from the power supply to the host device continues, while a new separate path to the battery is created for battery charging.

Electrical Paths

The internal wiring and associated elements of a receptacle 257 in FIG. 6 can be better understood by referencing the information related to FIGS. 7A and B. The original battery housing contacts—that constitute the existing battery-to-host interface port—are not shown, but for purposes of this discussion, they are generically represented by contacts 295A and 283A in FIG. 7A. The original mating contacts in a host device's battery bay are here represented generically as contacts 295B and 283B. By interposing a receptacle of the connector assembly between the original contacts exposed along a face of the removable battery housing that mate with aligned contacts at the host device, a new paradigm of power and data connectivity to peripheral devices is achieved, with superior results. The most significant result achieved by the connector assembly of the invention is that, by accessing the battery directly, the power requirements of any unknown battery-powered host device are immediately and easily discovered.

The receptacle features opposing pairs of self-closing contacts. When the plug is removed, the battery and its host device are seamlessly reconfigured as they were before . . . basically, the adaptation of the receptacle to the original battery and its host device becomes electrically transparent.

The operation of a connector assembly 200 in FIGS. 1 and 6 can be illustrated by an example, wherein an external power source is a power supply which includes an A/D converter and a simple voltage comparator circuit. The power supply configures its output voltage according to one or more power-related parameters acquired from the attached battery. A processor uses the acquired battery information to determine the optimum output signal, and a controller configures the power supply to output the optimized signal.

It would be beneficial to know the power parameters of the host device, so that the external power supply could be configured to match these power parameters. This can be done by sampling the voltage (and perhaps the current) of the battery that powers the host device. Since the battery is the power source matched to the host device by the device manufacturer, an external power supply need only deliver the power output parameters of the battery in order to deliver a correct power signal to the host device.

Because the connector assembly is interposed between the battery and its host device, the external power supply is able to read the voltage of the battery and, if necessary, place a line load on the battery's output to read battery voltage under load.

Voltage readings would be slightly depressed if a diode is in the circuit, but this slight voltage drop can be compensated for in the calculations performed by the external device's controller/processor. Or, a bleed resistor is attached to circumvent the diode, thus ensuring an accurate battery voltage reading.

A Hall-effect device, or other methods of reading current known to those skilled in the art, can be used to acquire a battery's current-delivery parameters, but these may not be necessary to the proper operation of the external power source.

SUMMARY AND SCOPE OF THE INVENTION

The benefits of a connector assembly that creates different electrical paths when a plug is inserted, removed, and/or rotated include, for example, (but are not limited to) the following:

1) Diminish the need to be charging a battery pack when an external power source is available. By not charging a battery every time a host device is connected to an external source of power, the life expectancy of the battery is increased. Since most rechargeable battery-powered electronic devices automatically charge their batteries when external power is connected, the use of a connector that disables the battery charge function increases the useful life of the battery, thus reducing total operating cost.

2) Some locations may not find battery charging practical. Battery charging can consume 20–40% of the entire load schedule of a host device's power requirements. If a car's battery is low, operating a host device such as a laptop that is powered from the dashboard outlet could result in a stranded motorist.

3) Some transportation locations may not be suitable for battery charging. There is some risk in charging batteries, especially high-density Lithium-Ion batteries. An airline, or cruise ship operator, for example, may wish to limit the risk of an onboard battery-related fire or explosion. A simple and cost effective method would be to use battery packs and power cords that have a connector which disables the charge function, while still allowing an external power supply to power the host device only.

4) Extended-run-time external battery packs can be used to supplement a host-device's associated battery. These extra-high-capacity battery packs connect to a host device's existing power input jack. So configured, the external battery pack most likely is dedicating some of its stored energy to charging the host device's battery. This occurs because host systems are designed to charge the associated battery whenever external power is available.

As a power source, a host device usually does not distinguish an external battery from an AC/DC wall adapter, for example, so the extended-run-time battery loses its effectiveness by having to relinquish some amount of its stored energy to charging the host's battery. By using a connector as defined herein, the external battery pack can be routed through the host device's existing battery pack and, by doing so, the charging circuits with the host device are temporarily disabled while the external battery source is in use. This enhances the run-time of the external battery pack, and also eliminates inefficient energy transfers between the two batteries.

These non-limiting examples of applications for connector assemblies such as those described in this document show some real-world uses.

Basic Design Parameters

Some of the design parameters achieved by the connector assemblies discussed herein include:

1) Small package size, especially for the receptacle, since available space within battery packs is limited.
2) Straightforward way to integrate a female connector into an existing battery pack, or to install the receptacle in a new battery pack design in a way that doesn't require an inordinate amount of extra tooling or assembly.
3) Inexpensive
4) Simplicity of use Ramifications A number of advantages of the connector assembly of the present invention become evident:

(a). A simple, low-cost connector can be used to electrically separate two devices, or a host device and its power system.

(b). By isolating the battery source, or a peripheral, from the original host device, new circuits are created that allow external power sources or battery chargers to perform more safely because the battery voltage can be verified before that external power is applied to a host device.

(c). Because the plug can function as a "key" that has more than one position, additional circuits or wiring configurations can be created to perform specialty functions or operations.

(d). As a "key," the male connector can be interchangeable at the end of a power or data cord, to afford access control to equipment or electronic devices.

(e). With very small form factors, the connector can be embedded inside a battery pack, to make it a self-contained device that has a special power or data interface to external power or charging devices, or monitoring equipment. This can be accomplished without having to rewire or otherwise modify the host device. By replacing the existing battery pack with one configured with the connector, the functionality of both the battery and host device is enhanced, without permanent reconfigurations to either the battery pack or host device.

(f). The connector can be used as a replacement for an existing input power jack with minimal modifications or rewiring.

(g). Problems in changing both male and female connectors on electronic devices that have incompatible external adapter output voltages are no longer necessary. Instead, the female receptacle is simply wired in a different configuration, and a new plug is used to differentiate the two incompatible external adapters. Any fear of possible mismatched voltages between external power adapters and host devices is eliminated.

(h). In certain modalities of the connector that use a female connector that self-closes to reinstate a circuit, the need for an ON/OFF power switch in conjunction with a power input jack is eliminated. The male plug is configurable to turn the host device on when the plug is inserted into the receptacle.

(i). Certain modalities of the connector can be equipped with a latching mechanism that secures the male and female assemblies, an important feature for devices like laptops that are often moved around the local area in industrial or service applications.

(j). In certain environments, host devices that automatically charge their batteries when external power is applied can be easily modified by inserting a battery pack that has the connector installed. Thus configured, the host device is rendered compliant.

(k). Monitoring battery charging can be done by an external device attached to the connector.

(l). Simultaneous battery monitoring and power delivery from an external device can be done without modifying the internal circuitry of the host device.

(m). By installing an N-signal switch that switches in response to applied power signals, and locating that switch in either the male or female assemblies of the connector, battery monitoring and power delivery can occur with a two-conductor cable that shares more than two contacts in the connector.

SCOPE OF THE INVENTION

Thus, the reader will see that the connector apparatus of the invention provides a convenient, low cost, and when the receptacle is embedded in an a battery enclosure, inconspicuous and easily upgradeable interface device that not only provides safe power delivery by disabling battery charging, but enhances the overall functionality of any existing (or future) electronic and electrical goods by providing an interface to which a multiplicity of peripherals can be attached.

Although the description above contains many specificities, these should not be construed as limiting the scope of the invention, but as merely providing illustrations of some of the presently preferred embodiments of this invention. Many other variations are possible. For example, a "smart security key" that functions for automotive and other uses has a small button-activated transmitter that has an integrated plug shaft with contact pads that mate to a receptacle integrated into a car's door locking mechanism. The button is connected to a scanner that matches the thumb print of the car owner, so that every time the button is activated, a verification of car ownership is performed by a processor. Then, when the plug is inserted into the door lock, a data transfer occurs which confirms that it is the valid owner that is inserting the security key. Provision can also be made for a "valet" usage simply by the owner holding down the button for a predetermined (and atypical) period of time. Thus, the scope of the invention should be determined by the appended claims and their legal equivalents, rather than by the embodiments illustrated herein.

Thus, a positionable connector assembly for transferring electrical signals, including power and input/output data among multiple electrical devices and their components, is described in conjunction with one or more specific embodiments. The invention is defined by the claims and their full scope of equivalents.

I claim:

1. A connector assembly for transfer of electrical signals among a plurality of selectable devices, sources, or peripherals, said connector assembly comprising:

a selectively positionable connector plug comprising an insulator shaft having one or more conductive contact pads arranged longitudinally thereon so as to expose one or more insulated areas thereof; and a connector receptacle for receiving said connector plug, said receptacle comprising one or more spring-loaded opposing conductive contacts located so as to selectively engage said one or more contact pads or insulated areas of said positionable plug;

wherein, mating said plug and receptacle in at least one selectable position of the connector plug aligns at least one of said exposed insulated areas of said shaft with at least one of said receptacle's conductive contacts for selectively engaging at least one of said insulated areas with at least one conductive contact, and at least one of said contact pads with at least one conductive contact, thereby causing the transfer of one or more electrical signals between at least one of said plurality of selectable devices, sources, or peripherals thereof attached to said selectively positionable connector plug and at least one of said plurality of selectable devices, sources, or peripherals attached to said connector receptacle.

2. The connector assembly of claim 1, wherein said one or more conductive contacts form at least a first closed circuit; and said positioning of said connector plug aligns at least one of said one or more selectively insulated areas to engage at least one of said receptacle's conductive contacts for disrupting said first closed circuit.

3. The connector assembly of claim 2, wherein a selecting of a first position of said positionable connector plug aligns at least one of said one or more conductive contact pads with at least one of said receptacle's one or more conductive contacts for selectively engaging at least one of said contact pads with at least one conductive contact; whereby the selecting of said first position causes a source selected from among said plurality of selectable devices, sources or peripherals to transfer one or more particular electrical signals to a selected peripheral along a second closed circuit.

4. The connector assembly of claim 3, wherein said selected source is a power source and said selected peripheral is for monitoring said power source.

5. The connector assembly of claim 2, wherein a selecting of a first position of said positionable connector plug also aligns at least one of said one or more conductive contact pads with at least one of said receptacle's one or more conductive contacts for selectively engaging at least one of said contact pads with at least one conductive contact; whereby the selecting of said first position further causes a peripheral selected from among said plurality of selectable devices, sources or peripherals to transfer one or more particular electrical signals to said selected device accessible along a second closed circuit.

6. The connector assembly of claim 5, wherein said selected device is an electrical device for receiving power and said selected peripheral is a configurable power supply.

7. The connector assembly of claim 2, wherein a selecting of a second position of said positionable connector plug also aligns at least one of said one or more conductive contact pads with at least one of said receptacle's one or more conductive contacts for selectively engaging at least one of said contact pads with at least one conductive contact; whereby the selecting of said second position further causes a peripheral selected from among said plurality of selectable devices, sources or peripherals to transfer one or more particular electrical signals to said selected device accessible along a third closed circuit.

8. The connector assembly of claim 7, wherein said selected device is an electrical device for receiving power and said selected peripheral is a configurable power supply.

9. The connector assembly of claim 1, wherein said at least one of said plurality of selectable devices, sources or peripherals attached to said connector plug is an electrical device and said at least one of said plurality of selectable devices, sources or peripherals attached to said connector receptacle is a battery.

10. The connector assembly of claim 2, wherein a selecting of a second position of said positionable connector plug aligns at least one of said one or more conductive contact pads with at least one of said receptacle's one or more conductive contacts for selectively engaging at least one of said contact pads with at least one conductive contact; whereby the selecting of said second position causes a peripheral selected from among said plurality of selectable devices, sources or peripherals to transfer one or more particular electrical signals to a selected source along a third closed circuit.

11. The second position of claim 10, wherein said selected peripheral is a battery charger and said selected source is a rechargeable battery.

12. The connector assembly of claim 1, wherein said at least one of said plurality of selectable devices, sources or peripherals attached to said connector plug is a charging source and said at least one of said plurality of selectable devices, sources or peripherals attached to said connector receptacle is a battery.

13. The connector assembly of claim 1, wherein one or more of said plurality of selectable devices, sources, or peripherals includes:
one of said plurality of selected devices being a battery-powered electrical device;
a first source being a battery; and
a second source being a power source other than the battery of said first source.

14. The connector assembly of claim 1, wherein one or more of said plurality of selectable devices, sources, or peripherals includes:
one of said plurality of selectable devices, sources, or peripherals being a battery having an interface port accessible to an electrical device for transferring electrical signals, the battery being attached to said connector receptacle;
the electrical device accessing said connector receptacle at the battery interface port; and
a power source capable of transferring electrical signals, the power source being attached to said positionable connector plug;
wherein mating said positionable connector plug to said connector receptacle disengages access for transferring electrical signals between the battery and the electrical device, and the mating also engages access for transferring electrical signals between the power source and the electrical device.

15. The connector assembly of claim 1, wherein the electrical signals being transferred are either analog or digital.

16. The connector assembly of claim 15, wherein one or more of said electrical signals are selectively transferred among said one or more selected devices, sources, or peripherals based on one or more of said analog or digital signals as control signals.

17. An apparatus for transfer of electrical signals among one or more selectable devices, sources, or peripherals, said apparatus comprising:
a connector receptacle for transferring said electrical signals of one or more devices, sources, or peripherals selectable from among said devices, sources, or peripherals;
said receptacle including at least one of one or more pairs of normally-closed spring-loaded beams terminating at selectable first and second opposing contacts, so that a conductor of the first opposing contact accesses at least a first of the one or more selected devices, sources, or peripherals, while a conductor of the second opposing contact is capable of accessing a second of the one or more selectable devices, sources, or peripherals;
said receptacle further includes a separate third contact having a conductor accessible to both the first and second devices, sources, or peripherals;
a positionable connector plug for electrically interconnecting at least a third device, source, or peripheral selected from among said selectable devices, sources, or peripherals;
said plug having an insulated shaft along which at least one conductor terminates at a contact pad located so as to attach an insulator area of the shaft to either the first opposing contact of the receptacle in a first selected position, or to the second opposing contact of the receptacle in a second selected position, either selected position thereby also electrically coupling the contact pad at the plug to the remaining non-selected opposing contact of the receptacle;
said positionable plug further having a separate conductive element so located as to electrically couple to the separate third contact of the receptacle, and
respective conductors of the conductive element of the plug for attaching at least the third device, source or peripheral;
wherein said first position of the plug is followed by said second position, so that electrical signals are transferred among the first, second, and third selected devices, sources, or peripherals.

18. The apparatus of claim 17, wherein at least one of said first or second selected positions of said connector plug causes said electrical signals to be selectively transferred between either at least one of the said first or second selectable devices, sources, or peripherals attached at said receptacle and said third selectable device, source, or peripheral attached at said plug.

19. The apparatus of claim 18, wherein said second selected device, source, or peripheral is an electrical device and said first selected device, source, or peripheral is a battery.

20. The apparatus of claim 18, wherein said second selected device, source, or peripheral is a mobile computing device and said third selected device, source, or peripheral is a power source.

21. The apparatus of claim 17, which further includes a device for controlling the flow of electrical signals strapped across said spring-loaded beams, causing only an outward electrical flow from said first device, source, or peripheral at said receptacle;
wherein said first selected position of said connector plug causes said second selected device, source, or peripheral to be accessible for transfers of electrical signals between said first and second selected devices, sources, or peripherals, and further transfers between said first and third devices, sources, or peripherals and said second and third selected devices, sources, or peripherals.

22. The apparatus of claim 21, wherein said device for controlling the flow of electrical signals further includes a bleed resistor also strapped across said spring-loaded beams for correcting a voltage signal as one of the electrical signals transferred between said first and second selected devices, sources, or peripherals.

23. The apparatus of claim 21, wherein said first selected device, source, or peripheral is a power source; said second selected device, source, or peripheral is a battery monitoring peripheral, and said third selected device, source, or peripheral is a battery charging peripheral.

24. The apparatus of claim 21, wherein said first, second, and third selected devices, sources, or peripherals of said first position include:

one of said selected devices, sources, or peripherals being a battery;

a second selected device, source, or peripheral being a battery-powered electrical device; and a third selected device, source, or peripheral being a power source other than the battery of the first selected device, source, or peripheral.

25. The apparatus of claim 17, wherein the electrical signals are either analog or digital.

26. A connector assembly for transfer of electrical signals among one or more selected devices, sources, or peripherals, said connector assembly comprising:

a positionable connector plug comprising an insulated shaft having one or more conductive contact pads that are selectively configured for transferring electrical signals;

the plug further comprising areas along the insulated shaft so located as to oppose at least one contact pad in an alignment that exposes both the insulated area and contact pads for attaching to selective contacts of a connector receptacle; and the connector receptacle for receiving said connector plug comprising self-closing opposing contacts for attaching to said one or more contact pads or insulated areas of said connector plug;

wherein upon mating the connector plug at the connector receptacle, said one or more electrical signals are transferred between said connector plug's one or more contact pads and said connector receptacle's opposing contacts and, therefrom, transferred selectively among each of the one or more selected devices, sources, or peripherals along conductors that are electrically attached to the plug's contact pads and the receptacle's opposing contacts.

27. The connector assembly of claim 26, wherein the connector plug is positioned for selecting a device, source, or peripheral from among interconnected devices, sources, or peripherals to be inaccessible for transferring electrical signals, wherein said connector plug presents said insulated area for attaching to a receptacle contact that previously engaged said opposing contact pad, so that the receptacle contact becomes electrically inactive, thereby causing electrical signals of at least one from among the one or more interconnected devices to be inaccessible.

28. An apparatus for redirecting a transfer of electrical signals among selectable electrical devices, sources, or peripherals, comprising:

a first source of electrical signals having conductors coupled to contacts accessible to a port at the electrical device;

a receptacle attached to said conductors for providing access to a second source of electrical signals, comprising self-closing contacts along at least one of said conductors for establishing a closed connection between the first source and the electrical device;

a positionable plug for attaching the second source of electrical signals to the receptacle, comprising an insulated shaft along which are arranged one or more conductive contact pads so that at least one contact pad or exposed insulated area is accessible the receptacle's self-closing contacts, as determined by the position of the mated plug; and at least one of one or more elements for controlling the direction of electrical flow strapped across conductors accessible to said first source, for providing access to electrical signals directed only from said first source;

wherein said plug separates the self-closing contacts at the receptacle, thereby disengaging said first source from the contacts accessible to said port at the electrical device and a first position of said plug couples a first contact pad to the self-losing contact along the conductor directed to the first source, and further;

wherein said plug's contact pad engages the self-closing contact of the receptacle directed to the first source, thereby electrically coupling said second source to the contacts accessible to said port at the first source;

thereby redirecting a transfer of electrical signals between said first source and the second source, instead of said electrical device.

29. The apparatus of claim 28, wherein the first source is a battery and the second source is an attachable power source, so that electrical signals for transfer between said battery and said electrical device are disengaged when said power source is attached to said receptacle, and instead said electrical signals transfer between said power source and said electrical device.

30. The apparatus of claim 28, wherein a second position of said plug causes the self-closing contacts at the receptacle to be separated, so that said insulated area couples to the self-closing contact directed to the electrical device, disengaging said second source from the contacts accessible to said port at the electrical device; and further wherein said plug's contact pad couples to the self-closing contact directed to said first source, engaging said second source to said first source;

thereby redirecting a transfer of electrical signals between said second source and said first source, instead of said electrical device.

31. The apparatus of claim 30, wherein the first source is a battery and the second source is an attachable power source, so that electrical signals for transfer between said second source and said electrical device are disengaged when said power source is attached to said receptacle, and instead said electrical signals transfer between said power source and said battery.

32. The apparatus of claim 30, wherein said plug's contact pad couples to the self-closing contact directed to said first source as a battery, thereby electrically connecting said battery to said second source as an attachable power source that configures its controlled output based on electrical signals transferred between said battery and said power source.

33. The apparatus of claim 30, wherein the second position of said plug couples its contact pad to the self-closing contact at the receptacle directed to said first source as a battery for electrically connecting said battery to said second source as an attachable power supply that configures its controlled output based on electrical signals transferred between said battery and said power source;

wherein after said plug is reconfigured in a first position so that its insulated area couples to the self-closing contact directed to said battery; and said plug's contact pad couples to the self-closing contact directed to said electrical device for directing said power supply's configured output to said electrical device;

thereby said electrical device is powered from said power supply without charging said battery.

34. The apparatus of claim 33, wherein said power supply is embedded in a transportation vehicle and said battery is for powering a mobile computing device.

35. The apparatus of claim 30, wherein said transferred electrical signals are analog or digital.

36. The apparatus of claim 28, wherein said receptacle is installed in a battery housing.

37. The apparatus of claim 28, wherein said receptacle is installed in an accessible area of said electrical device, replacing a power-input jack.

38. A connector assembly for transfer of electrical signals among one or more selected devices, sources, or peripherals, comprising:

- at least one of one or more peripherals selected from among selectable devices, sources, or peripherals attached to a positionable connector plug comprising an insulated shaft encapsulating at least two conductors, each terminating to at least one of one or more contact pads aligned longitudinally along opposing faces of the plug, so positioned that either the contact pads or an insulated area of the shaft engages each contact of a plurality of pre-tensioned opposed pairs of thereof at a connector receptacle;
- the connector receptacle interposed along at least two conductors electrically coupling at least one of one or more sources selected from among the selectable devices, sources, or peripherals and at least one of one or more devices selected from among the selectable devices, sources, or peripherals each conductor terminating in the contact of each of the opposing pre-tensioned pairs; and
- one or more elements for controlling the direction of flow of a signal along at least one of said conductors, for transferring electrical signals only in a direction from a the selected source to the selected peripheral;
- whereby mating the connector plug to the receptacle in a first position opens the pre-tensioned contacts so that at least one contact engages said plug's insulator area, thereby electrically isolating said source from said device and, further;
- whereby an axial rotation of said plug to a second position causes said contact pads to engage said pre-tensioned contacts, for electrically coupling the selected source and device to the selected peripheral;
- so that electrical signals are no longer transferred between said source and device but, instead, the signals from the source to the peripheral, and signals between the peripheral and device are also transferred.

* * * * *